United States Patent
Yang et al.

(10) Patent No.: US 12,293,722 B2
(45) Date of Patent: May 6, 2025

(54) SHIFT REGISTER HAVING SCAN CICUIT AND RESET CIRCUIT, SCAN DRIVING CIRCUIT AND DISPLAY SUBSTRATE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Huijuan Yang, Beijing (CN); Maoying Liao, Beijing (CN); Bo Zhang, Beijing (CN); Xiaoqing Shu, Beijing (CN); Liheng Wei, Beijing (CN); Lingtong Li, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/925,696

(22) PCT Filed: Dec. 21, 2021

(86) PCT No.: PCT/CN2021/140079
§ 371 (c)(1),
(2) Date: Nov. 16, 2022

(87) PCT Pub. No.: WO2023/115331
PCT Pub. Date: Jun. 29, 2023

(65) Prior Publication Data
US 2024/0221675 A1    Jul. 4, 2024

(51) Int. Cl.
G09G 3/3266    (2016.01)
G09G 3/32      (2016.01)
G11C 19/28     (2006.01)

(52) U.S. Cl.
CPC ........... *G09G 3/3266* (2013.01); *G09G 3/32* (2013.01); *G09G 2300/0426* (2013.01);
(Continued)

(58) Field of Classification Search
CPC .......... G09G 3/3266; G09G 3/32; G09G 2300/0426; G09G 2310/0267;
(Continued)

(56) References Cited

U.S. PATENT DOCUMENTS

2012/0162170 A1    6/2012   Ochiai et al.
2019/0116324 A1*   4/2019   Yamamoto ............. H04N 25/74
(Continued)

FOREIGN PATENT DOCUMENTS

CN    110060645 A    7/2019
CN    111243650 A    6/2020
(Continued)

*Primary Examiner* — David D Davis
(74) *Attorney, Agent, or Firm* — Dority & Manning, P.A.

(57) ABSTRACT

A shift register is configured to be applied to a display substrate including a plurality of rows of sub-pixels. The shift register is electrically connected to a single row of sub-pixels, and is further configured to transmit a scan signal and a reset signal to the single row of sub-pixels. The shift register includes a scan circuit and a reset circuit. The scan circuit is configured to output the scan signal due to cooperation of a first input signal, a first clock signal, a second clock signal, a first voltage signal and a second voltage signal. The reset circuit is configured to output the reset circuit due to cooperation of a second input signal, a third clock signal, a fourth clock signal, a third voltage signal and a fourth voltage signal. The scan circuit and the reset circuit are configured to output signals independently from each other.

20 Claims, 12 Drawing Sheets

(52) U.S. Cl.
CPC .............. *G09G 2310/0267* (2013.01); *G09G 2310/0286* (2013.01); *G09G 2310/08* (2013.01); *G09G 2330/021* (2013.01); *G11C 19/28* (2013.01)

(58) Field of Classification Search
CPC ....... G09G 2310/0286; G09G 2310/08; G09G 2330/021; G09G 3/20; G09G 3/3677; G09G 3/36; G11C 19/28
See application file for complete search history.

(56) References Cited

U.S. PATENT DOCUMENTS

2021/0327339 A1* 10/2021 Feng .................... G09G 3/2092
2021/0358384 A1 11/2021 Liu et al.

FOREIGN PATENT DOCUMENTS

| CN | 111276097 A | * | 6/2020 | ........... G09G 3/3208 |
| CN | 113066435 A | | 7/2021 | |
| KR | 20110123459 A | | 11/2011 | |

* cited by examiner

Poly

Gate1

Gate2

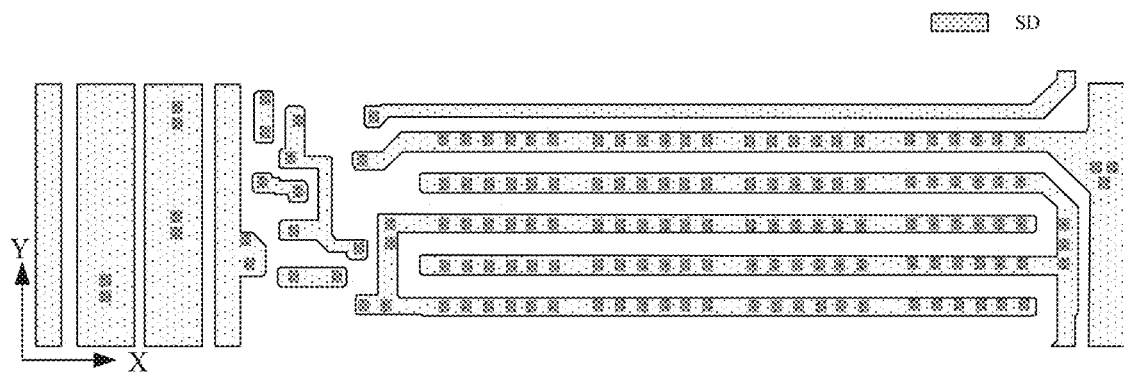
FIG. 17
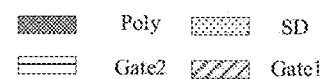
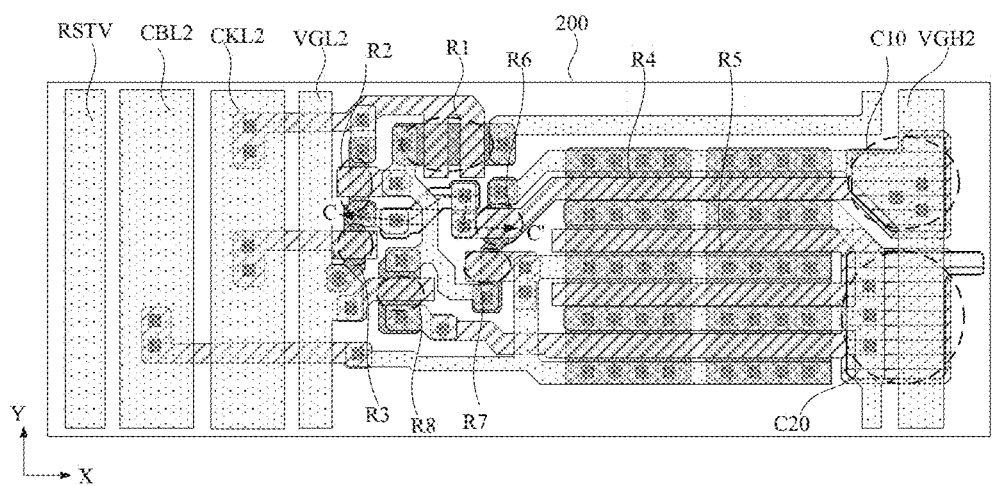
FIG. 18
FIG. 19

Shift register having scan circuit and reset circuit, scan driving circuit and display substrate

SHIFT REGISTER HAVING SCAN CICUIT AND RESET CIRCUIT, SCAN DRIVING CIRCUIT AND DISPLAY SUBSTRATE

CROSS-REFERENCE TO RELATED APPLICATION

This application is a national phase entry under 35 USC 371 of International Patent Application No. PCT/CN2021/140079, filed on Dec. 21, 2021, which is incorporated herein by reference in its entirety.

TECHNICAL FIELD

The present disclosure relates to the field of display technologies, and in particular, to a shift register, a scan driving circuit and a display substrate.

BACKGROUND

With the progress of the display technologies, the semiconductor element, as the core of a display substrate, has also achieved great progress. Organic light-emitting diodes (OLEDs), as current-type light-emitting devices, have been increasingly used in high-performance display substrates due to their characteristics such as self-luminescence, fast response, wide viewing angle, and being able to be fabricated on flexible substrates.

SUMMARY

In an aspect, a shift register is provided. The shift register is configured to be applied to a display substrate. The display substrate includes a plurality of rows of sub-pixels. The shift register is electrically connected to a single row of sub-pixels in the plurality of rows of sub-pixels, and is further configured to transmit a scan signal and a reset signal to the single row of sub-pixels. The shift register includes a scan circuit and a reset circuit. The scan circuit is electrically connected to a first input signal terminal, a first clock signal terminal, a second clock signal terminal, a first voltage signal terminal and a second voltage signal terminal; the scan circuit is configured to output the scan signal due to cooperation of a first input signal transmitted by the first input signal terminal, a first clock signal transmitted by the first clock signal terminal, a second clock signal transmitted by the second clock signal terminal, a first voltage signal transmitted by the first voltage signal terminal and a second voltage signal transmitted by the second voltage signal terminal; the reset circuit is electrically connected to a second input signal terminal, a third clock signal terminal, a fourth clock signal terminal, a third voltage signal terminal and a fourth voltage signal terminal; the reset circuit is configured to output the reset signal due to cooperation of a second input signal transmitted by the second input signal terminal, a third clock signal transmitted by the third clock signal terminal, a fourth clock signal transmitted by the fourth clock signal terminal, a third voltage signal transmitted by the third voltage signal terminal and a fourth voltage signal transmitted by the fourth voltage signal terminal. The scan circuit and the reset circuit are configured to output signals independently from each other.

In some embodiments, the scan circuit includes a first output transistor. A first electrode of the first output transistor is electrically connected to the second voltage signal terminal, and a second electrode of the first output transistor is electrically connected to a scan signal output terminal. The reset circuit includes a second output transistor. A first electrode of the second output transistor is electrically connected to the fourth voltage signal terminal, and a second electrode of the second output transistor is electrically connected to a reset signal output terminal. A channel width of the first output transistor is greater than or equal to a channel width of the second output transistor.

In some embodiments, a ratio of the channel width of the first output transistor to the channel width of the second output transistor is in a range from 1:1 to 20:1.

In some embodiments, the scan circuit includes a third output transistor. A first electrode of the third output transistor is electrically connected to the second clock signal terminal, and a second electrode of the third output transistor is electrically connected to a scan signal output terminal. The reset circuit includes a fourth output transistor. A first electrode of the fourth output transistor is electrically connected to the fourth clock signal terminal, and a second electrode of the fourth output transistor is electrically connected to a reset signal output terminal. A channel width of the third output transistor is greater than or equal to a channel width of the fourth output transistor.

In some embodiments, a ratio of the channel width of the third output transistor to the channel width of the fourth output transistor is in a range from 1:1 to 20:1.

In some embodiments, the scan circuit and the reset circuit are arranged in parallel along a row direction, or the scan circuit and the reset circuit are staggered along the row direction.

In some embodiments, the reset circuit is closer to the single row of sub-pixels than the scan circuit.

In some embodiments, the scan circuit includes: a first input transistor, a second input transistor, a first control transistor, a second control transistor, a third control transistor, a fourth control transistor, a first output transistor, a third output transistor, a first capacitor and a second capacitor. A control electrode of the first input transistor is electrically connected to the first clock signal terminal, a first electrode of the first input transistor is electrically connected to the first voltage signal terminal, and a second electrode of the first input transistor is electrically connected to a second node. A control electrode of the second input transistor is electrically connected to the first clock signal terminal, a first electrode of the second input transistor is electrically connected to the first input signal terminal, and a second electrode of the second input transistor is electrically connected to a first node. A control electrode of the first control transistor is electrically connected to the first node, a first electrode of the first control transistor is electrically connected to the first clock signal terminal, and a second electrode of the first control transistor is electrically connected to the second node. A control electrode of the second control transistor is electrically connected to the second node, a first electrode of the second control transistor is electrically connected to the second voltage signal terminal, and a second electrode of the second control transistor is electrically connected to a third node. A control electrode of the third control transistor is electrically connected to the second clock signal terminal, a first electrode of the third control transistor is electrically connected to the third node, and a second electrode of the third control transistor is electrically connected to the first node. A control electrode of the fourth control transistor is electrically connected to the first voltage signal terminal, a first electrode of the fourth control transistor is electrically connected to the first node, and a second electrode of the fourth control transistor is electrically connected to a fourth node. A control electrode of the first output transistor is electrically connected to the second node, a first electrode of the first output transistor is electrically connected to the second voltage signal terminal, and a second electrode of the first output transistor is electrically connected to a scan signal output terminal. A control electrode of the third output transistor is electrically connected to the fourth node, a first electrode of the third output transistor is electrically connected to the second clock signal terminal, and a second electrode of the third output transistor is electrically connected to the scan signal output terminal. A first electrode plate of the first capacitor is electrically connected to the second voltage signal terminal, and a second electrode plate of the first capacitor is electrically connected to the second node. A first electrode plate of the second capacitor is electrically connected to the scan signal output terminal, and a second electrode plate of the second capacitor is electrically connected to the fourth node.

In some embodiments, the reset circuit includes: a third input transistor, a fourth input transistor, a fifth control transistor, a sixth control transistor, a seventh control transistor, an eighth control transistor, a second output transistor, a fourth output transistor, a third capacitor and a fourth capacitor. A control electrode of the third input transistor is electrically connected to the third clock signal terminal, a first electrode of the third input transistor is electrically connected to the third voltage signal terminal, and a second electrode of the third input transistor is electrically connected to a sixth node. A control electrode of the fourth input transistor is electrically connected to the third clock signal terminal, a first electrode of the fourth input transistor is electrically connected to the second input signal terminal, and a second electrode of the fourth input transistor is electrically connected to a fifth node. A control electrode of the fifth control transistor is electrically connected to the fifth node, a first electrode of the fifth control transistor is electrically connected to the third clock signal terminal, and a second electrode of the fifth control transistor is electrically connected to the sixth node. A control electrode of the sixth control transistor is electrically connected to the sixth node, a first electrode of the sixth control transistor is electrically connected to the fourth voltage signal terminal, and a second electrode of the sixth control transistor is electrically connected to a seventh node. A control electrode of the seventh control transistor is electrically connected to the fourth clock signal terminal, a first electrode of the seventh control transistor is electrically connected to the seventh node, and a second electrode of the seventh control transistor is electrically connected to the fifth node. A control electrode of the eighth control transistor is electrically connected to the third voltage signal terminal, a first electrode of the eighth control transistor is electrically connected to the fifth node, and a second electrode of the eighth control transistor is electrically connected to an eighth node. A control electrode of the second output transistor is electrically connected to the sixth node, a first electrode of the second output transistor is electrically connected to the fourth voltage signal terminal, and a second electrode of the second output transistor is electrically connected to a reset signal output terminal. A control electrode of the fourth output transistor is electrically connected to the eighth node, a first electrode of the fourth output transistor is electrically connected to the fourth clock signal terminal, and a second electrode of the fourth output transistor is electrically connected to the reset signal output terminal. A first electrode plate of the third capacitor is electrically connected to the fourth voltage signal terminal, and a second electrode plate of the third capacitor is electrically connected to the sixth node. A first electrode plate of the fourth capacitor is electrically connected to the reset signal output terminal, and a second electrode plate of the fourth capacitor is electrically connected to the eighth node.

In another aspect, a scan driving circuit is provided. The scan driving circuit includes a plurality of shift registers according to any one of the above embodiments. Scan circuits in the plurality of shift registers are arranged sequentially along a column direction, and reset circuits in the plurality of shift registers are arranged sequentially along the column direction.

In some embodiments, the scan driving circuit further includes: a first voltage signal line extending along the column direction and being electrically connected to the first voltage signal terminal of the scan circuit; a second voltage signal line extending along the column direction and being electrically connected to the second voltage signal terminal of the scan circuit; a third voltage signal line extending along the column direction and being electrically connected to the third voltage signal terminal of the reset circuit; and a fourth voltage signal line extending along the column direction and being electrically connected to the fourth voltage signal terminal of the reset circuit. The scan circuit is disposed between the first voltage signal line and the second voltage signal line, and the reset circuit is disposed between the third voltage signal line and the fourth voltage signal line.

In some embodiments, the second voltage signal line and the third voltage signal line are disposed between the scan circuit and the reset circuit.

In some embodiments, the scan driving circuit further includes: a first clock signal line extending along the column direction and being electrically connected to a first clock signal terminal of a (2m−1)-th scan circuit and a second clock signal terminal of a 2m-th scan circuit; a second clock signal line extending along the column direction and being electrically connected to a second clock signal terminal of the (2m−1)-th scan circuit and a first clock signal terminal of the 2m-th scan circuit; a third clock signal line extending along the column direction and being electrically connected to a third clock signal terminal of the (2m−1)-th reset circuit and a fourth clock signal terminal of the 2m-th reset circuit; a fourth clock signal line extending along the column direction and being electrically connected to a fourth clock signal terminal of the (2m−1)-th reset circuit and a third clock signal terminal of the 2m-th reset circuit, m being a positive integer. The first clock signal line and the second clock signal line are disposed on a side of the scan circuit away from the reset circuit; the third clock signal line and the fourth clock signal line are disposed on a side of the reset circuit proximate to the scan circuit.

In some embodiments, the scan circuit further includes a first initial signal line extending along the column direction and being electrically connected to first input signal terminals of scan circuits in first n shift registers of the plurality of shift registers, n being a positive integer; a second initial signal line extending along the column direction and being electrically connected to second input signal terminals of reset circuits in first i shift registers of the plurality of shift registers, i being a positive integer. The first initial signal line is disposed on a side of the scan circuit away from the reset circuit; the second initial signal line is disposed on a side of the reset circuit proximate to the scan circuit.

In another aspect, a display substrate is provided. The display substrate includes a substrate, a plurality of rows of sub-pixels disposed on the substrate, and at least one scan driving circuit according to any one of the above embodiments. The at least one scan driving circuit is disposed on the substrate. Each shift register in the scan driving circuit is electrically connected to one row of sub-pixels, and is configured to transmit a scan signal and a reset signal to the one row of sub-pixels.

In some embodiments, the at least one scan driving circuit includes two scan driving circuits; and the two scan driving circuits are located on two opposite sides of the plurality of rows of sub-pixels, respectively.

In some embodiments, the display substrate includes a semiconductor layer disposed on the substrate. A first output transistor of the scan circuit in the shift register includes a first active layer, and the first active layer includes a first channel portion. A second output transistor of the reset circuit in the shift register includes a second active layer, and the second active layer includes a second channel portion. The first active layer and the second active layer are both located in the semiconductor layer. A channel width of the first channel portion is greater than or equal to a channel width of the second channel portion.

In some embodiments, a direction of the channel width of the first channel portion and a direction of the channel width of the second channel portion are the same as a row direction.

In some embodiments, a third output transistor of the scan circuit includes a third active layer, and the third active layer includes a third channel portion. A fourth output transistor of the reset circuit includes a fourth active layer, and the fourth active layer includes a fourth channel portion. The third active layer and the fourth active layer are both located in the semiconductor layer. A channel width of the third channel portion is greater than or equal to a channel width of the fourth channel portion.

In some embodiments, a direction of the channel width of the third channel portion and a direction of the channel width of the fourth channel portion are the same as the row direction.

In some embodiments, the first active layer and the third active layer are arranged sequentially along a column direction, the column direction intersecting the row direction; and/or, the second active layer and the fourth active layer are arranged sequentially along the column direction.

In some embodiments, the first active layer and the third active layer are of an integral structure; and/or, the second active layer and the fourth active layer are of an integral structure.

In some embodiments, the display substrate further includes a gate conductive layer and a source-drain conductive layer that are disposed on a side of the semiconductor layer away from the substrate and stacked sequentially. A first electrode plate of a second capacitor of the scan circuit is located in the gate conductive layer a second electrode of the first output transistor and a second electrode of a third output transistor of the scan circuit are of an integral structure, and both are located in the source-drain conductive layer; a second electrode of the first output transistor is electrically connected to the first electrode plate of the second capacitor; a scan signal output terminal of the scan circuit and the first electrode plate of the second capacitor are of an integral structure.

In some embodiments, a first electrode plate of a fourth capacitor of the reset circuit is located in the gate conductive layer; a second electrode of the second output transistor and a second electrode of a fourth output transistor of the reset circuit are of an integral structure, and are both located in the source-drain conductive layer; the second electrode of the second output transistor is electrically connected to the first electrode plate of the fourth capacitor; a reset signal output terminal of the reset circuit and the first electrode plate of the fourth capacitor are of an integral structure.

In some embodiments, a first input transistor of the scan circuit includes a fifth active layer disposed on a side of the first active layer away from the plurality of rows of sub-pixels. A first control transistor of the scan circuit includes a sixth active layer disposed on the side of the first active layer away from the plurality of rows of sub-pixels. A second control transistor of the scan circuit includes a seventh active layer disposed between the fifth active layer and the first active layer. A third control transistor of the scan circuit includes an eighth active layer disposed between the fifth active layer and the first active layer. A fourth control transistor of the scan circuit includes a ninth active layer disposed between the fifth active layer and the eighth active layer. The fifth active layer, the sixth active layer, the seventh active layer, the eighth active layer and the ninth active layer are all located in the semiconductor layer. A direction of a channel length of the fifth active layer, a direction of a channel length of the sixth active layer, a direction of a channel length of the seventh active layer, a direction of a channel length of the eighth active layer and a direction of a channel length of the ninth active layer are the same as a column direction, the column direction intersecting the row direction.

In some embodiments, the fifth active layer and the sixth active layer are arranged sequentially along the column direction, and are of an integral structure; and/or, the seventh active layer and the eighth active layer are arranged sequentially along the column direction, and are of an integral structure.

In some embodiments, a third input transistor of the reset circuit includes a tenth active layer disposed on a side of the second active layer away from the plurality of rows of sub-pixels. A fifth control transistor of the reset circuit includes an eleventh active layer disposed on the side of the second active layer away from the plurality of rows of sub-pixels. A sixth control transistor of the reset circuit includes a twelfth active layer disposed between the tenth active layer and the second active layer. A seventh control transistor of the reset circuit includes a thirteenth active layer disposed between the tenth active layer and the second active layer. An eighth control transistor of the reset circuit includes a fourteenth active layer disposed between the tenth active layer and the thirteenth active layer. The tenth active layer, the eleventh active layer, the twelfth active layer, the thirteenth active layer and the fourteenth active layer are all located in the semiconductor layer; a direction of a channel length of the tenth active layer, a direction of a channel length of the eleventh active layer, a direction of a channel length of the twelfth active layer, a direction of a channel length of the thirteenth active layer and a direction of a channel length of the fourteenth active layer are the same as the column direction.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these accompanying drawings. In addition, the accompanying drawings in the following description may be regarded as schematic diagrams, and are not limitations on actual sizes of products, actual processes of methods and actual timings of signals involved in the embodiments of the present disclosure.

FIG. 17 is a top view of a part of some other layers in a scan circuit, in accordance with some embodiments of the present disclosure;

FIG. 18 is a top view of a part of a display substrate, in accordance with some embodiments of the present disclosure;

FIG. 19 is a partial sectional view of the display substrate shown in FIG. 18 taken along the C-C' direction;

DETAILED DESCRIPTION

Figure 1:
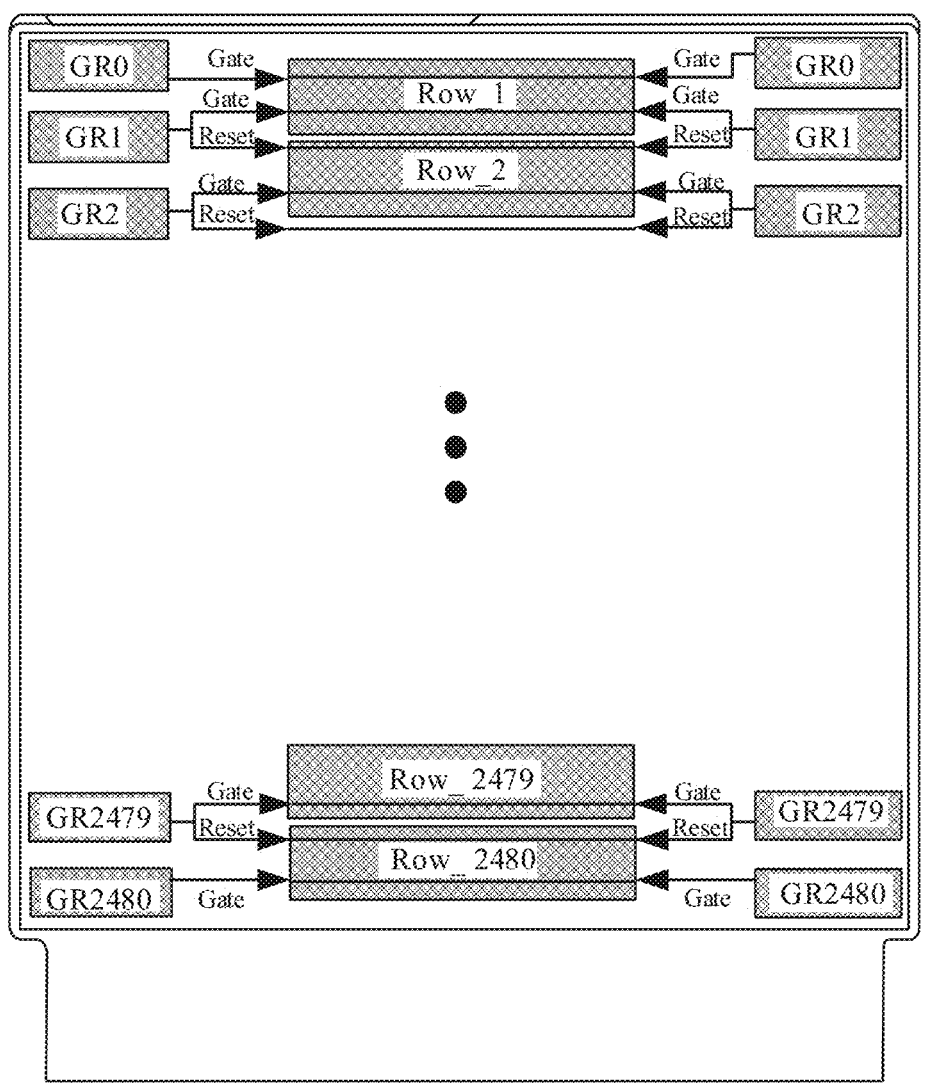
FIG. 1 is a structural diagram of a display substrate, in accordance with an implementation manner.

Technical solutions in some embodiments of the present disclosure will be described clearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed in an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, unless otherwise specified, the term "a plurality of/the plurality of" means two or more.

In the description of some embodiments, terms such as "coupled" and "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The use of the phrase "suitable for" or "configured to" herein means an open and inclusive expression, which does not exclude devices that are applicable to or configured to perform additional tasks or steps.

Additionally, the use of the phrase "based on" is meant to be open and inclusive, since a process, step, calculation or other action that is "based on" one or more of the stated conditions or values may, in practice, be based on additional conditions or value beyond those stated.

As used herein, the term such as "about", "substantially" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

The term such as "parallel", "perpendicular" or "equal" as used herein includes a stated condition and a condition similar to the stated condition. A range of the similar condition is within an acceptable range of deviation of a particular value. The acceptable range of deviation is determined by a person of ordinary skill in the art in view of measurement in question and the error associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that, when a layer or an element is referred to as being on another layer or a substrate, the layer or the element may be directly on the another layer or substrate, or intervening layer(s) may also be present between the layer or the element and the another layer or substrate.

Exemplary embodiments are described herein with reference to sectional views and/or plan views as idealized exemplary drawings. In the accompanying drawings, thickness of layers and sizes of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature being curved. Therefore, the regions shown in the accompanying drawings are schematic in nature, and their shapes are not intended to show actual shapes of the regions in a device, and are not intended to limit the scope of the exemplary embodiments.

In circuits (e.g., a shift register and a pixel driving circuit) provided in the embodiments of the present disclosure, transistors used in the shift register may be thin film transistors (TFTs), metal oxide semiconductors (MOSs) or other switching devices with like characteristics, and the embodiments of the present disclosure are described by taking an example where the transistors are thin film transistors.

In the circuits provided in the embodiments of the present disclosure, a control electrode of each transistor is a gate of the transistor, a first electrode of the transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, the transistor is a P-type transistor, the first electrode of the transistor is the source, and the second electrode of the transistor is the drain. For example, the transistor is an N-type transistor, the first electrode of the transistor is the drain, and the second electrode of the transistor is the source.

In the embodiments of the present disclosure, the capacitors may be capacitor devices separately manufactured through a process. For example, the capacitor devices are each realized by manufacturing special capacitor electrodes, and each capacitor electrode of the capacitor may be realized through a metal layer, a semiconductor layer (e.g., doped with polysilicon), or the like. The capacitor may further be realized through a parasitic capacitance between transistors, or through a transistor itself and another device or wire, or through a parasitic capacitance between wires of a circuit itself.

In the circuit provided in the embodiments of the present disclosure, nodes such as a first node and a second node do not represent actual components, but represent junctions of related electrical connections in a circuit diagram. That is, these nodes are nodes equivalent to junctions of relevant electrical connections in the circuit diagram. A signal may be designated by the same reference character as a signal terminal (or a node) transmitting this signal.

The transistors included in the circuits provided in the embodiments of the present disclosure may all be N-type transistors, or may all be P-type transistors, or some of them may be N-type transistors and the other transistors may be P-type transistors. In the present disclosure, the phrase "active level" refers to a level that can cause a transistor to be turned on. The P-type transistor may be turned on under control of a low-level signal, and the N-type transistor may be turned on under control of a high-level signal.

Hereinafter, the circuits provided in the embodiments of the present disclosure are described by taking an example where the transistors included in the circuits are all P-type transistors.

Some embodiments of the present disclosure provide a shift register, a scan driving circuit and a display substrate. The shift register, the scan driving circuit and the display substrate will be introduced below.

Figure 2:
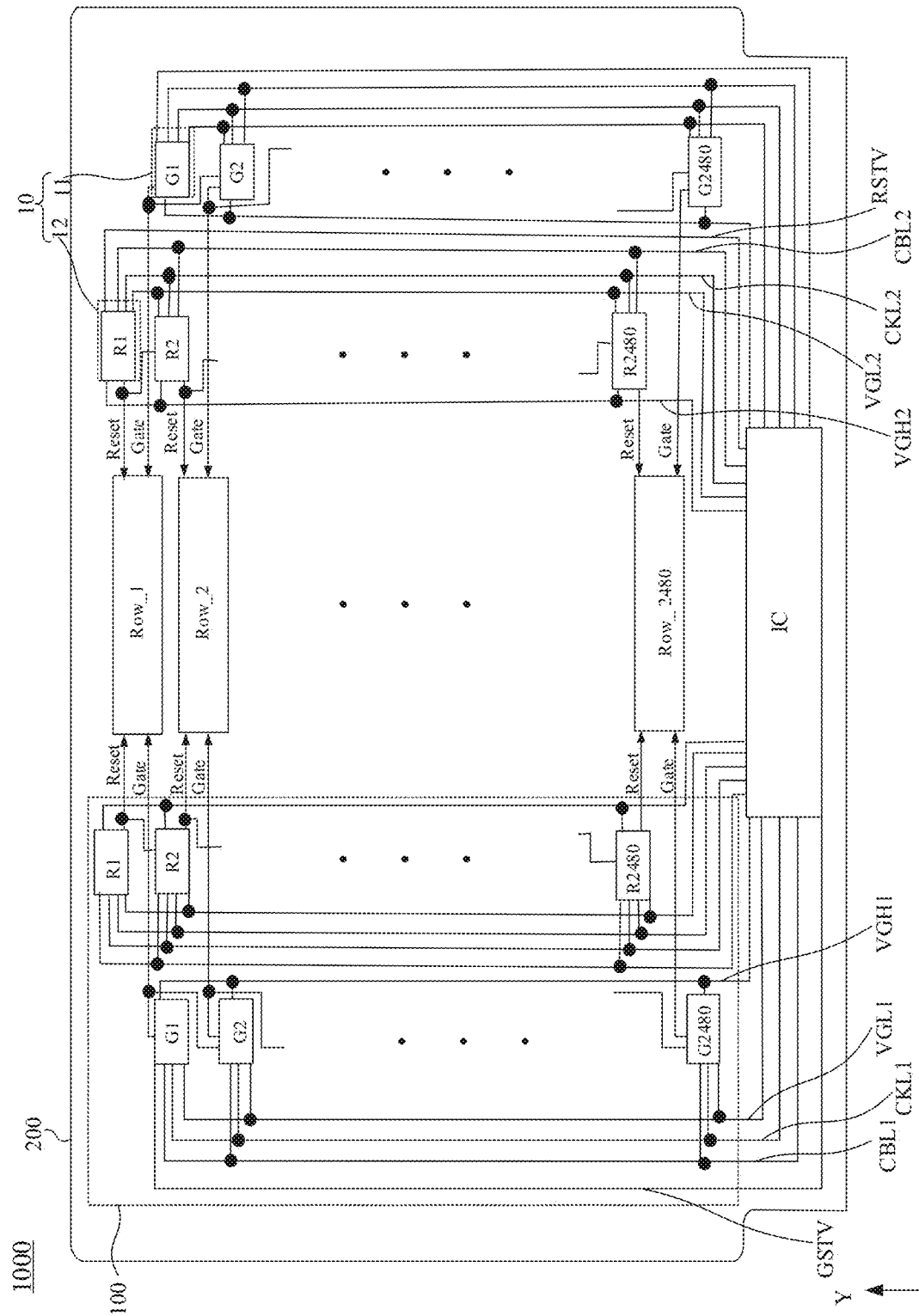
FIG. 2 is a structural diagram of a display substrate, in accordance with some embodiments of the present disclosure.

The embodiments of the present disclosure provide the display substrate 1000 as shown in FIG. 2. The display substrate 1000 may be any display substrate that displays images whether in motion (e.g., a video) or stationary (e.g., a static image), and whether textual or graphical. More specifically, it is anticipated that the display substrate in the embodiments may be implemented in or associated with a variety of electronic devices. The variety of electronic devices may include (but are not limited to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., display of rear view camera in vehicles), electronic photos, electronic billboards or signs, projectors, architectural structures, packagings and aesthetic structures (e.g., a display for an image of a piece of jewelry).

The display substrate 1000 may be, for example, an organic light-emitting diode (OLED) display substrate, a quantum dot light-emitting diode (QLED) display substrate, a micro light-emitting diode (micro LED) display substrate or a mini light-emitting diode (mini LED) display substrate, which is not specifically limited to in the present disclosure.

The embodiments of the present disclosure will be schematically described below by taking an example in which the display substrate 1000 is an OLED display substrate.

In some embodiments, as shown in FIG. 2, the display substrate 1000 includes a substrate 200, a plurality of rows of sub-pixels Row disposed on the substrate 200 and at least one scan driving circuit 100 disposed on the substrate 200.

In some examples, as shown in FIG. 2, the display substrate 1000 includes 2480 rows of sub-pixels Row. The first row of sub-pixels, the second row of sub-pixels, . . . , the 2479-th row of sub-pixels and the 2480-th row of sub-pixels may be represented by Row_1, Row_2, . . . , Row_2479 and Row_2480, respectively. Each row of sub-pixels Row includes a plurality of sub-pixels 300 (referring to FIG. 4).

In some examples, the substrate 200 may be a flexible substrate, or a rigid substrate.

For example, in a case where the substrate 200 is a flexible substrate, the substrate 200 may be made of a material with high elasticity such as dimethyl siloxane, polyimide (PI), polyethylene terephthalate (PET), etc.

For example, in a case where the substrate 200 is a rigid substrate, the base 200 may be made of glass or the like.

Figure 4:
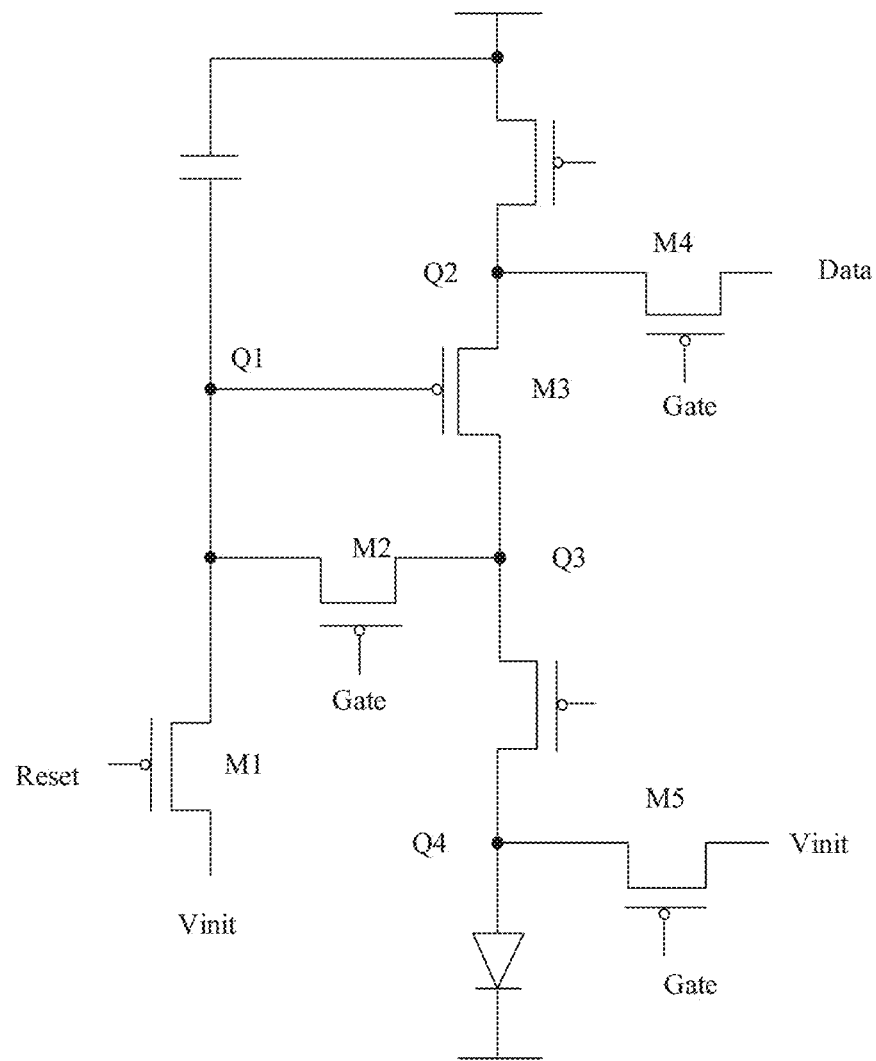
FIG. 4 is a structural diagram of a sub-pixel, in accordance with some embodiments of the present disclosure.

In some examples, as shown in FIG. 4, the sub-pixel 300 includes a pixel driving circuit and a light-emitting device.

The structure of the pixel driving circuit may vary, which may be determined according to actual needs. For example, the structure of the pixel driving circuit may include a structure of "4T1C", "6T1C", "7T1C", "6T2C", "7T2C" or "8T2C". Herein, "T" represents a transistor, and the number in front of "T" represents the number of transistors, "C" represents a storage capacitor, and the number in front of "C" represents the number of storage capacitors.

For example, the light-emitting device may include an anode, a light-emitting layer and a cathode that are sequentially stacked. In addition, the light-emitting device may further include, for example, a hole injection layer and/or a hole transport layer disposed between the anode and the light-emitting layer, and may further include, for example, an electron transport layer and/or an electron injection layer disposed between the light-emitting layer and the cathode. The pixel driving circuit may be, for example, electrically connected to the anode of the light-emitting device.

In conjunction with FIG. 4, the structure of the sub-pixel will be schematically described below by taking an example in which the pixel driving circuit has a "7T1C" structure. It will be noted that, the electrical connection relationship between seven transistors and one storage capacitor included in the pixel driving circuit may also be in other forms, which is not limited to the electrical connection relationship described in these examples.

For example, as shown in FIG. 4, the pixel driving circuit includes a first reset transistor M1, a switching transistor M4, a driving transistor M3, a compensation transistor M2 and a second reset transistor M5.

For example, as shown in FIG. 4, a control electrode of the first reset transistor M1 is electrically connected to a reset signal terminal Reset, a first electrode of the first reset transistor M1 is electrically connected to an initial signal terminal Vinit, and a second electrode of the first reset transistor M1 is electrically connected to a first pixel node Q1. The first reset transistor M1 is configured to be turned on under control of a reset signal transmitted by the reset signal terminal Reset, and transmits an initial signal received from the initial signal terminal Vinit to the first pixel node Q1, so as to reset the first pixel node Q1.

For example, as shown in FIG. 4, a control electrode of the second reset transistor M5 is coupled to a scan signal terminal Gate, a first electrode of the second reset transistor M5 is coupled to the initial signal terminal Vinit, and a second electrode of the second reset transistor M5 is coupled to the anode of the light-emitting device. The second reset transistor M5 is configured to be turned on under control of a scan signal transmitted by the scan signal terminal Gate, and transmits an initial signal received from the initial signal terminal Vinit to the anode of the light-emitting device, so as to reset the anode of the light-emitting device.

For example, as shown in FIG. 4, a control electrode of the switching transistor M4 is electrically connected to the scan signal terminal Gate, a first electrode of the switching transistor M4 is electrically connected to a data signal terminal Date, and a second electrode of the switching transistor M4 is electrically connected to a second pixel node Q2. The switching transistor M4 is configured to be turned on under the control of the scan signal transmitted by the scan signal terminal Gate, and transmits a data signal transmitted by the data signal terminal Data to the second pixel node Q2.

For example, as shown in FIG. 4, a control electrode of the driving transistor M3 is electrically connected to the first pixel node Q1, a first electrode of the driving transistor M3 is electrically connected to the second pixel node Q2, and a second electrode of the driving transistor M3 is electrically connected to a third pixel node Q3. The driving transistor M3 is configured to be turned on under control of a voltage of the first pixel node Q1, and transmits a signal (e.g., the data signal) from the second pixel node Q2 to the third pixel node Q3.

For example, as shown in FIG. 4, a control electrode of the compensation transistor M2 is electrically connected to the scan signal terminal Gate, a first electrode of the compensation transistor M2 is electrically connected to the third pixel node Q3, and a second electrode of the compensation transistor M2 is electrically connected to the first pixel node Q1. The compensation transistor M2 is configured to be turned on under the control of the scan signal transmitted by the scan signal terminal Gate, and transmits a signal (e.g., the data signal) from the third pixel node Q3 to the first pixel node Q1, so as to compensate a threshold voltage of the driving transistor M3.

Since the control electrode of the switching transistor M4 and the control electrode of the compensation transistor M2 are both electrically connected to the scan signal terminal Gate, the switching transistor M4 and the compensation transistor M2 may be turned on simultaneously under the control of the scan signal. The data signal transmitted by the data signal terminal Data is transmitted to the first pixel node Q1 through the switching transistor M4, the driving transistor M3 and the compensation transistor M2 in sequence, and until the driving transistor M3 is in an off state, the compensation for the threshold voltage of the driving transistor M3 is completed. At the same time, the second reset transistor M5 may also be turned on under the control of the scan signal, and receives the initial signal and transmits it to the anode of the light-emitting device, so as to reset the anode of the light-emitting device.

For example, the driving method of the sub-pixel includes a reset period, and a data writing and compensation period that are sequentially performed.

For example, in the reset period, the first reset transistor M1 is turned on under the control of the reset signal, and transmits the initial signal to the first pixel node Q1, so as to reset the first pixel node Q1.

For example, in the data writing and compensation period, the second reset transistor M5 is turned on under the control of the scan signal, and transmits the initial signal to the anode of the light-emitting device, so as to reset the anode of the light-emitting device. The switching transistor M4 is turned on under the control of the scan signal, and transmits the data signal to the second pixel node Q2 to complete the writing of the data signal. The driving transistor M3 is turned on under control of a voltage of the first pixel node Q1, and transmits the signal (e.g., the data signal) from the second pixel node Q2 to the third pixel node Q3. The compensation transistor M2 is turned on under the control of the scan signal, and transmits the signal (e.g., the data signal) from the third pixel node Q3 to the first pixel node Q1 to compensate the threshold voltage of the driving transistor M3; until the driving transistor M3 is in an off state, the compensation for the threshold voltage of the driving transistor M3 is completed.

Figure 5:
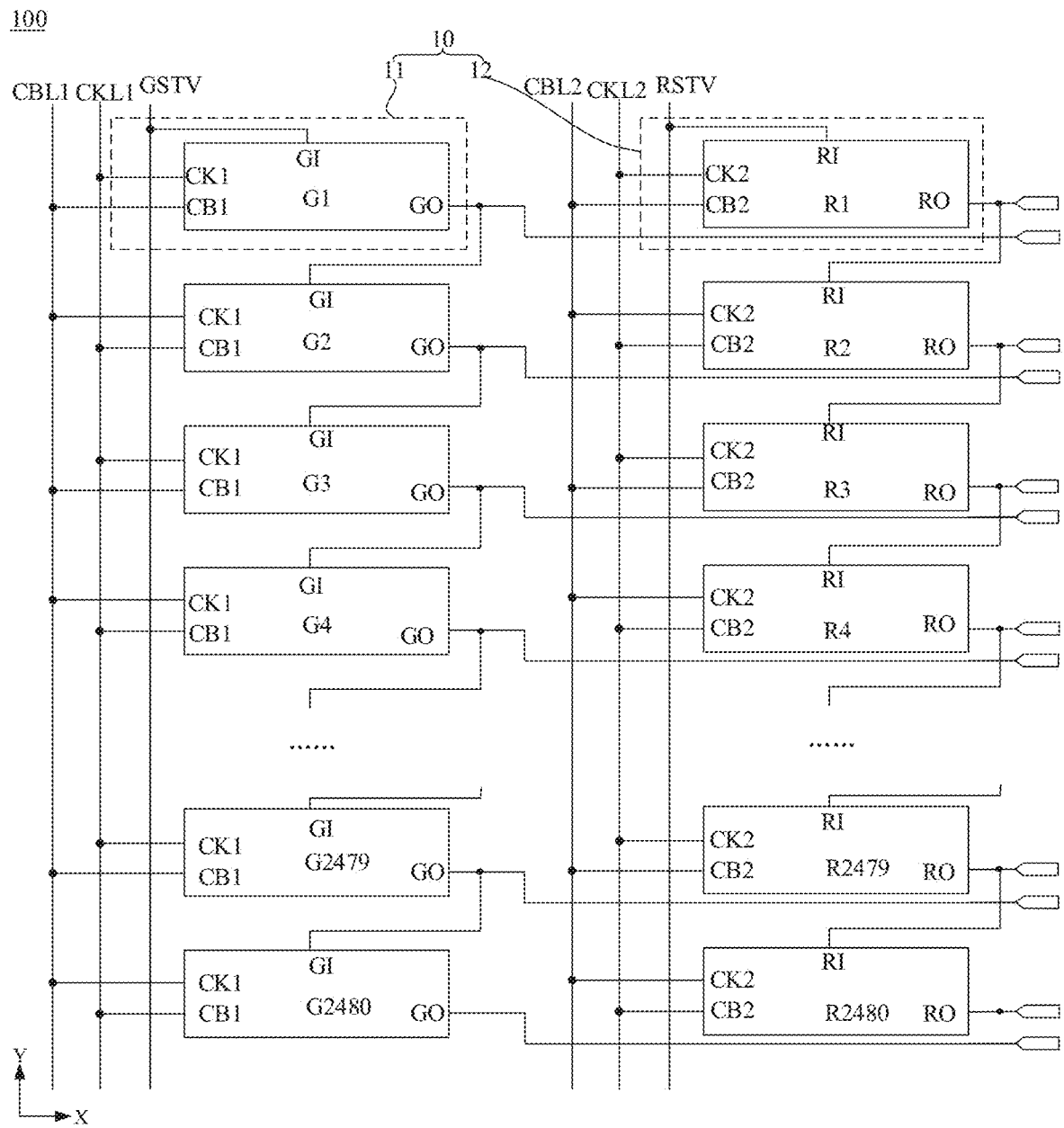
FIG. 5 is a structural diagram of a scan driving circuit, in accordance with some embodiments of the present disclosure.

In some examples, as shown in FIG. 5, the scan driving circuit 100 includes a plurality of shift registers 10. The scan signal transmitted by the scan signal terminal Gate and the reset signal transmitted by the reset signal terminal Reset of the sub-pixel 300 are provided by the shift register 10.

In an implementation manner, as shown in FIG. 1, the shift register may be represented by GR, for example, GR0, GR1, GR2, . . . , GR2479 and GR2480 may represent a first shift register, a second shift register, a third shift register, . . . , a 2480-th shift register and a 2481-th shift register, respectively. Each shift register is electrically connected to adjacent two rows of sub-pixels Row. Each shift register has a single output signal terminal.

Considering the second shift register as an example, the second shift register GR1 is electrically connected to the first row of sub-pixels Row_1 and the second row of sub-pixels Row_2. A signal output by the second shift register GR1 may be transmitted to the first row of sub-pixels Row_1 and used as a reset signal transmitted by each reset signal terminal of the first row of sub-pixels Row_1; meanwhile, the signal output by the second shift register GR1 may be transmitted to the second row of sub-pixels Row_2 and used as a scan signal transmitted by each scan signal terminal of the second row of sub-pixels Row_2.

That is to say, a same shift register GR is required to be electrically connected to two rows of sub-pixels Row, and drives the two rows of sub-pixels Row simultaneously. In this way, the load of the shift register GR is large, and the accuracy of the signal output by the shift register GR is reduced. As a result, the reset time, and data writing and compensation time of the sub-pixel is reduced, and the display effect of the display substrate is affected.

Figure 6:
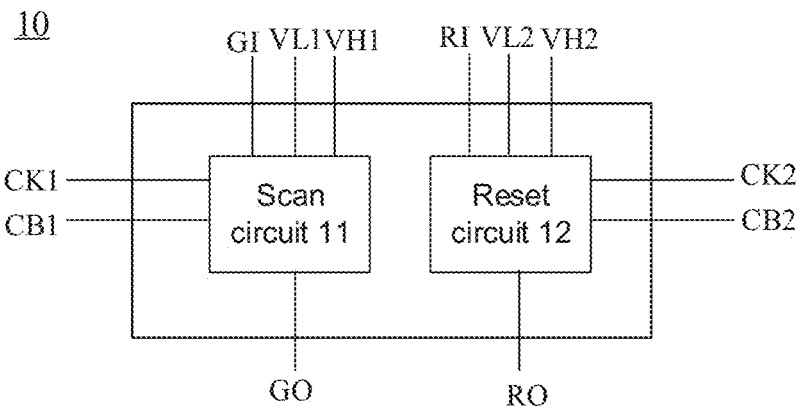
FIG. 6 is a structural diagram of a shift register, in accordance with some embodiments of the present disclosure.

In light of this, as shown in FIG. 6, the shift register 10 provided in the embodiments of the present disclosure includes a scan circuit 11 and a reset circuit 12. The shift register 10 is applied to the display substrate 1000.

In some examples, as shown in FIG. 6, the scan circuit 11 is electrically connected to a first input signal terminal GI, a first clock signal terminal CK1, a second clock signal terminal CB1, a first voltage signal terminal VL1 and a second voltage signal terminal VH1. The scan circuit 11 is configured to output a scan signal Gate due to cooperation of a first input signal output by the first input signal terminal GI, a first clock signal transmitted by the first clock signal terminal CK1, a second clock signal transmitted by the second clock signal terminal CB1, a first voltage signal transmitted by the first voltage signal terminal VL1, and a second voltage signal transmitted by the second voltage signal terminal VH1.

In some examples, as shown in FIG. 6, the reset circuit 12 is electrically connected to a second input signal terminal RI, a third clock signal terminal CK2, a fourth clock signal terminal CB2, a third voltage signal terminal VL2 and a fourth voltage signal terminal VH2. The reset circuit 12 is configured to output a reset signal Reset due to cooperation of a second input signal transmitted by the second input signal terminal RI, a third clock signal transmitted by the third clock signal terminal CK2, a fourth clock signal transmitted by the fourth clock signal terminal CB2, a third voltage signal transmitted by the third voltage signal terminal VL2, and a fourth voltage signal transmitted by the fourth voltage signal terminal VH2.

For example, the first voltage signal terminal VGL1 is configured to transmit a first direct current low-level signal (e.g., lower than or equal to a low-level portion of a clock signal). The first direct current low-level signal is referred to as the first voltage signal. The third voltage signal terminal VGL2 is configured to transmit a third direct current low-level signal (e.g., lower than or equal to a low-level portion of a clock signal). The third direct current low-level signal is referred to as the third voltage signal.

For example, the level of the first voltage signal and the level of the third voltage signal may be the same.

For example, the second voltage signal terminal VH1 is configured to transmit a second direct current high-level signal (e.g., higher than or equal to a high-level portion of a clock signal). The second direct current high-level signal is referred to as the second voltage signal. The fourth voltage signal terminal VH2 is configured to transmit a fourth direct current high-level signal (e.g., higher than or equal to a high-level portion of a clock signal). The fourth direct current high-level signal is referred to as the fourth voltage signal.

For example, the level of the second voltage signal and the level of the fourth voltage signal may be the same.

For example, the first clock signal terminal CK1 is configured to transmit the first clock signal (e.g., with a low-level portion and a high-level portion). The second clock signal terminal CB1 is configured to transmit the second clock signal (e.g., with a low-level portion and a high-level portion).

For example, a waveform of the first clock signal and a waveform of the second clock signal may be the same, and a duration in which the first clock signal is at an active level does not overlap with a duration in which the second clock signal is at an active level.

For example, the third clock signal terminal CK2 is configured to transmit the third clock signal (e.g., with a low-level portion and a high-level portion). The fourth clock signal terminal CB2 is configured to transmit the fourth clock signal (e.g., with a low-level portion and a high-level portion).

For example, a waveform of the third clock signal and a waveform of the fourth clock signal may be the same, and a duration in which the third clock signal is at an active level does not overlap with a duration in which the fourth clock signal is at an active level.

In some examples, as shown in FIG. 5, the scan circuit 11 and the reset circuit 12 output signals independently from each other.

For example, there is no electrical connection between the scan circuit 11 and the reset circuit 12; the scan circuit 11 and the reset circuit 12 are designed independently, and output the scan signal and the reset signal respectively. A waveform of the scan signal and a waveform of the reset signal may be the same, but a duration in which the scan signal is at an active level does not overlap with a duration in which the reset signal is at an active level.

In some examples, as shown in FIG. 2, the shift register 10 is electrically connected to a single row of sub-pixels Row, and is configured to transmit the scan signal Gate and the reset signal Reset to the single row of sub-pixels Row. That is, the scan circuit 11 and the reset circuit 12 in the shift register 10 are both electrically connected to one row of sub-pixels Row, and transmit the scan signal Gate and the reset signal Reset to the row of sub-pixels Row, respectively. Therefore, the reset process of the row of sub-pixels Row is performed through the reset signal Reset, and the data writing and compensation process of the row of sub-pixels Row is performed through the scan signal Gate.

The shift register 10 in the embodiments of the present disclosure is electrically connected to only one row of sub-pixels Row, and transmits the scan signal Gate and the reset signal Reset to the one row of sub-pixels Row. Thus, the shift register 10 only drives one row of sub-pixels Row, and the reset process and the data writing and compensation process of the row of sub-pixels Row are realized. In this way, it is possible to reduce the load of the shift register 10, reduce the load of the scan driving circuit 100, improve the accuracy of the scan signal Gate and the reset signal Reset transmitted to the sub-pixels, and improve the display effect of the display substrate 1000.

The beneficial effects that can be realized by the scan driving circuit 100 and the display substrate 1000 provided in the embodiments of the present disclosure are the same as the beneficial effects that can be realized by the shift register 10, and details will not be repeated here.

Figure 7:
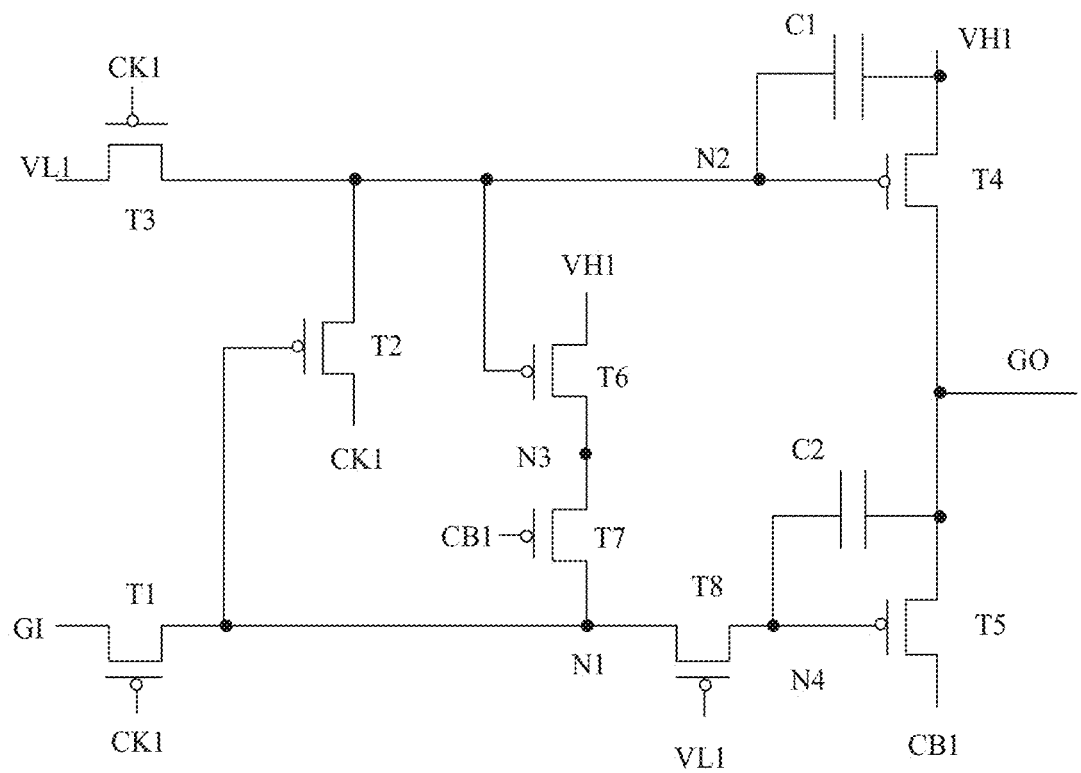
FIG. 7 is an equivalent structural diagram of a scan circuit, in accordance with some embodiments of the present disclosure.

In some embodiments, as shown in FIG. 7, the scan circuit 11 includes a first output transistor T4. A first electrode of the first output transistor T4 is electrically connected to the second voltage signal terminal VH1, and a second electrode of the first output transistor T4 is electrically connected to a scan signal output terminal GO.

In some examples, as shown in FIG. 7, the scan circuit 11 further includes a third output transistor T5. A first electrode of the third output transistor T5 is electrically connected to the second dock signal terminal CB1, and a second electrode of the third output transistor T5 is electrically connected to the scan signal output terminal GO.

For example, the first output transistor T4 and the third output transistor T5 are turned on in different time periods. In a time period in which the first output transistor T4 is turned on, the first output transistor T4 may receive the second voltage signal and transmit it to the scan signal output terminal GO, and output the second voltage signal from the scan signal output terminal GO as the scan signal Gate. In a time period in which the third output transistor T5 is turned on, the third output transistor T5 may receive the second clock signal and transmit it to the scan signal output terminal GO, and output the second clock signal from the scan signal output terminal GO as the scan signal Gate.

That is to say, the scan signal Gate is composed of the second voltage signal and the second clock signal.

Since the second voltage signal is a direct current high-level signal, and the switching transistor M4 and the compensation transistor M2 are required to be turned on under control of a low-level signal, an active-level portion of the scan signal Gate is formed of the second clock signal.

Figure 9:
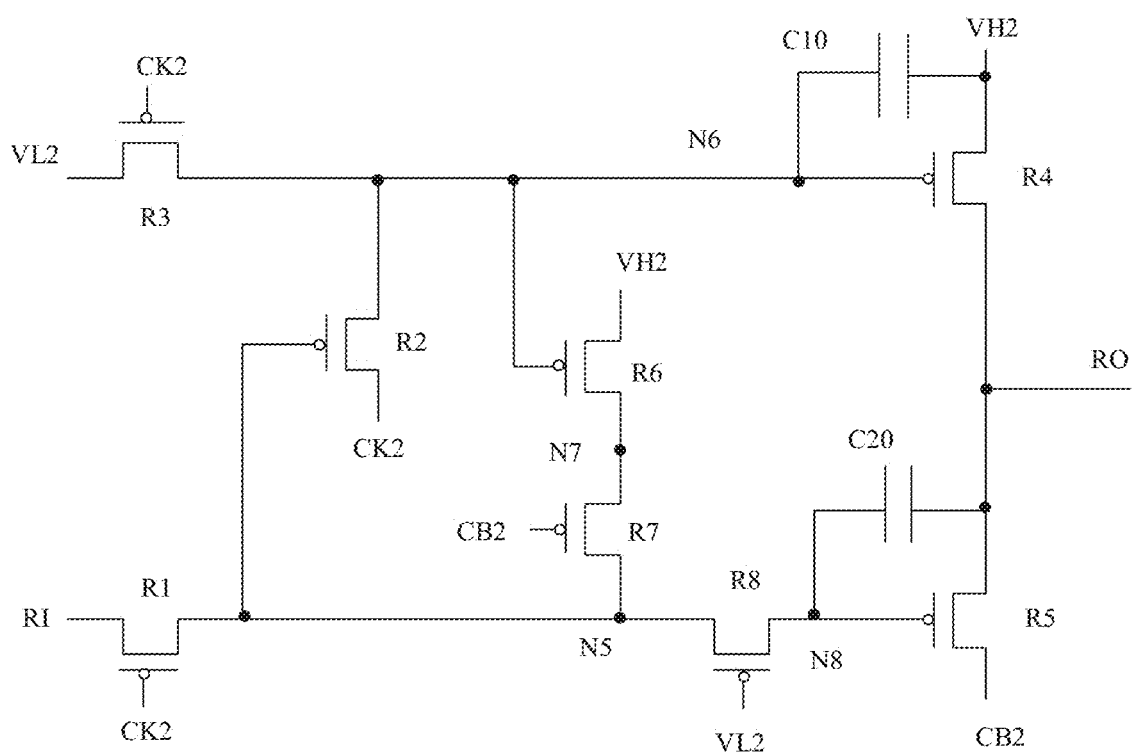
FIG. 9 is an equivalent structural diagram of a reset circuit, in accordance with some embodiments of the present disclosure.

In some examples, as shown in FIG. 9, the reset circuit 12 includes a second output transistor R4. A first electrode of the second output transistor R4 is electrically connected to the fourth voltage signal terminal VH2, and a second electrode of the second output transistor R4 is electrically connected to a reset signal output terminal RO.

In some examples, as shown in FIG. 9, the reset circuit 12 further includes a fourth output transistor R5. A first electrode of the fourth output transistor R5 is electrically connected to the fourth clock signal terminal CB2, and a second electrode of the fourth output transistor R5 is electrically connected to the reset signal output terminal RO.

For example, the second output transistor R4 and the fourth output transistor R5 are turned on in different time periods. In a time period in which the second output transistor R4 is turned on, the second output transistor R4 may receive the fourth voltage signal and transmit it to the reset signal output terminal RO, and output the fourth voltage signal from the reset signal output terminal RO as the reset signal Reset. In a time period in which the fourth output transistor R5 is turned on, the fourth output transistor R5 may receive the fourth clock signal and transmit it to the reset signal output terminal RO, and output the fourth clock signal from the reset signal output terminal RO as the reset signal Reset.

That is to say, the reset signal Reset is composed of the fourth voltage signal and the fourth clock signal.

Since the fourth voltage signal is a direct current high-level signal, and the first reset transistor M1 needs to be turned on under control of a low-level signal, an active-level portion of the reset signal Reset is formed of the fourth clock signal.

In some examples, a channel width of the first output transistor T4 is greater than or equal to a channel width of the second output transistor R4.

It will be noted that, a magnitude of a channel width of a thin film transistor affects the switching characteristic of the thin film transistor. In order to obtain a high operating current of a thin film transistor, it is necessary to increase a width-to-length ratio (W/L), for example, increase the channel width W or decrease the channel length L. The channel length L is basically a minimum distance on a basis that no short circuit between the source and the drain occurs on a technological level. Therefore, a high operating current may be obtained by increasing the channel width of the thin film transistor. The increase of the operating current represents the enhancement of the writing ability and the maintaining ability. In this way, it may be possible to reduce the power consumption of the thin film transistor, and in turn reduce the power consumption of the display substrate.

For example, the channel width of the first output transistor T4 is equal to the channel width of the second output transistor R4. Therefore, the power consumption of the first output transistor T4 in the scan circuit 11 is the same as the power consumption of the second output transistor R4 in the reset circuit 12.

For another example, the channel width of the first output transistor T4 is greater than the channel width of the second output transistor R4. Therefore, the power consumption of the first output transistor T4 in the scan circuit 11 is less than the power consumption of the second output transistor R4 in the reset circuit 12, and the power consumption of the display substrate 1000 may be reduced.

In some examples, a ratio of the channel width of the first output transistor T4 to the channel width of the second output transistor R4 is in a range from 1:1 to 20:1, inclusive.

For example, the ratio of the channel width of the first output transistor T4 to the channel width of the second output transistor R4 may be 1:1, 2:1, 3:1, 4:1, 10:1 or 20:1.

In some examples, a channel width of the third output transistor T5 is greater than or equal to a channel width of the fourth output transistor R5.

For example, the channel width of the third output transistor T5 is equal to the channel width of the fourth output transistor R5.

For another example, the channel width of the third output transistor T5 is greater than the channel width of the fourth output transistor R5. Therefore, the power consumption of the third output transistor T5 in the scan circuit 11 is less than the power consumption of the fourth output transistor R5 in the reset circuit 12, and it may be possible to improve the driving ability of the scan driving circuit 100 for the sub-pixels 300, and reduce the power consumption of the display substrate 1000.

In some examples, a ratio of the channel width of the third output transistor T5 to the channel width of the fourth output transistor R5 is in a range from 1:1 to 20:1, inclusive.

For example, the ratio of the channel width of the third output transistor T5 to the channel width of the fourth output transistor R5 may be 1:1, 2:1, 3:1, 4:1, 10:1 or 20:1.

Hereinafter, channel widths of output transistors in the shift register in the implementation manner, channel widths of output transistors in the reset circuit 12 in the present disclosure, and channel widths of output transistors in the scan circuit 11 in the embodiments of the present disclosure are set, and signals output by the shift register in the implementation manner, the reset signal output by the reset circuit in the embodiments of the present disclosure, and the scan signal output by the scan circuit in the embodiments of the present disclosure are detected, and the specific results are shown in the following tables.

TABLE 1

| Category | Channel width (μm) | Channel width (μm) |
|---|---|---|
| First output transistor in the shift register in the implementation manner | 150 | / |
| Second output transistor R4 in the reset circuit in the embodiments of the present disclosure | / | 35 |
| First output transistor T4 in the scan circuit in the embodiments of the present disclosure | / | 105 |
| Second output transistor in the shift register in the implementation manner | 450 | / |
| Fourth output transistor R5 in the reset circuit in the embodiments of the present disclosure | / | 105 |
| Third output transistor T5 in the scan circuit in the embodiments of the present disclosure | / | 315 |

TABLE 2

| Type | Parameter | The implementation manner (ns) | The embodiments of the present disclosure (ns) | Comparison with the implementation manner |
|---|---|---|---|---|
| Reset signal | Tr | 718 | 683 | −4.9% |
| Reset signal | Tf | 811 | 808 | −0.4% |
| Scan signal | Tr | 769 | 676 | −12.1% |
| Scan signal | Tf | 1006 | 904 | −10.1% |

For example, the channel widths of the output transistors in the shift register in the implementation manner, the channel widths of the output transistors in the reset circuit 11 in the embodiments of the present disclosure, and the channel widths of the output transistors in the scan circuit 12 in the embodiments of the present disclosure are set as shown in Table 1. It can be seen from Table 1 that, the ratio of the channel width of the first output transistor to the channel width of the second output transistor is 3:1, and the ratio of the channel width of the third output transistor to the channel width of the fourth output transistor is 3:1.

For example, the detection results of the signals output by the shift register in the implementation manner, the reset signal output by the reset circuit in the embodiments of the present disclosure, and the scan signal output by the scan circuit in the embodiments of the present disclosure are shown in Table 2. In Table 2, Tr represents a duration of a rising edge of the signal, and Tf represents a duration of a falling edge of the signal. The smaller the value of Tr, the shorter the duration of the rising edge of the signal; the smaller the value of Tf, the shorter the duration of the falling edge of the signal. If the value of Tr and the value of Tf are both relatively small, it indicates that the waveform of the signal is more regular and the accuracy of the signal is higher.

It can be seen from Table 2 that, the value of Tr of the reset signal in the solution of the present disclosure is smaller than the value of Tr of the reset signal in the implementation manner, and the value of Tr of the reset signal in the solution of the present disclosure is decreased by 4.9% compared with the value of Tr of the reset signal in the implementation manner; the value of Tf of the reset signal in the solution of the present disclosure is smaller than the value of Tf of the reset signal in the implementation manner, and the value of Tf of the reset signal in the solution of the present disclosure is decreased by 0.4% compared with the value of Tf of the reset signal in the implementation manner. The value of Tr of the scan signal in the solution of the present disclosure is smaller than the value of Tr of the scan signal in the implementation manner, and the value of Tr of the scan signal in the solution of the present disclosure is decreased by 12.1% compared with the value of Tr of the scan signal in the implementation manner; the value of Tf of the scan signal in the solution of the present disclosure is smaller than the value of Tf of the scan signal in the implementation manner, and the value of Tf of the scan signal in the solution of the present disclosure is decreased by 10.1% compared with the value of Tf of the scan signal in the implementation manner.

It will be noted that, the reset signal and the scan signal provided by the shift register in the implementation manner are the same, which are output by a same signal output terminal. Since the shift register drives a row of sub-pixels to be reset, and drives another row of sub-pixels to be scanned, the reset signal drives the first reset transistors M1 in the row of sub-pixels, and the scan signal drives the switching transistors M4, the second reset transistors M5, and the compensation transistors M2 in the another row of sub-pixels. Therefore, it is detected that the Tf of the scan signal is different from the Tf of the reset signal, the Tr of the scan signal is different from the Tr of the reset signal.

Therefore, in the embodiments of the present disclosure, a single shift register 10 is electrically connected to a single row of sub-pixels Row, a scan circuit 11 and a reset circuit 11 in the single shift register 10 are arrange independently, the channel width of the first output transistor T4 in the scan circuit 11 is greater than or equal to the channel width of the second output transistor R4 in the reset circuit 12, and the channel width of the third output transistor T5 in the scan transistor 11 is greater than or equal to the channel width of the fourth output transistor T5 in the reset circuit 12. In this way, not only the Tr and Tf of the scan signal Gate output by the scan circuit 11 but also the Tr and Tf of the reset signal Reset output by the reset circuit 12 may be reduced. Therefore, in the embodiments of the present disclosure, with the above arrangement manner, it may be possible to reduce the load of the shift register 10 and reduce the loss of the scan signal Gate and the reset signal Reset in the process of being transmitted to the sub-pixel 300, and in turn improve the accuracy of the scan signal Gate and the reset signal Reset. Furthermore, the reset period and the data writing and compensation period of the sub-pixel 300 are increased, which is conducive to reducing the power consumption of the display substrate 1000, and improving the display quality of the display substrate 1000.

In a same shift register 10, the arrangement manner between the scan circuit 11 and the reset circuit 12 varies, which may be set according to actual situations.

In some examples, as shown in FIG. 5, the scan circuit 11 and the reset circuit 12 in the same shift register 10 are arranged in parallel along a row direction X.

For example, the scan circuit 11 and the reset circuit 12 may be arranged in a same row as a row of sub-pixels Row electrically connected thereto.

In this way, the scan circuit 11 and the reset circuit 12 are arranged regularly, which may facilitate the wiring layout, and may reduce an area occupied by the shift register 10.

In some other examples, as shown in FIG. 2, in the same shift register 10, the scan circuit 11 and the reset circuit 12 are staggered along the row direction X.

For example, the scan circuit 11 may be arranged in a same row as a row of sub-pixels Row electrically connected thereto, and the reset circuit 12 may be arranged in a same row as another row of sub-pixels Row adjacent to the row of sub-pixels Row.

For example, along the row direction X, the scan circuit 11 may be located between adjacent two reset circuits 12.

By adopting the above arrangements, it may be possible to facilitate the wiring connection the scan circuit 11 or the reset circuit 12 and a corresponding row of sub-pixels Row.

In some embodiments, as shown in FIG. 2, the reset circuit 12 is closer to the row of sub-pixels Row, which is electrically connected to the reset circuit 12 and the scan circuit 11, than the scan circuit 11. In this case, a wire electrically connected to the reset signal output terminal RO of the reset circuit 12 and the corresponding row of sub-pixels Row is relatively short, so that the loss of the reset signal Reset is small, which is conducive to improving the accuracy and reliability of the reset signal Reset provided by the reset circuit 12 to the sub-pixel 300.

In some embodiments, as shown in FIG. 7, in the shift register 10, the scan circuit 10 includes: a first input transistor T3, a second input transistor T1, a first control transistor T2, a second control transistor T6, a third control transistor T7, a fourth control transistor T8, a first output transistor T4, a third output transistor T5, a first capacitor C1 and a second capacitor C2.

In some examples, as shown in FIG. 7, a control electrode of the first input transistor T3 is electrically connected to the first clock signal terminal CK1, a first electrode of the first input transistor T3 is electrically connected to the first voltage signal terminal VL1, and a second electrode of the first input transistor T3 is electrically connected to a second node N2.

For example, the first input transistor T3 is configured to be turned on under control of the first clock signal, and transmits the first voltage signal to the second node N2.

In some examples, as shown in FIG. 7, a control electrode of the second input transistor T1 is electrically connected to the first clock signal terminal CK1, a first electrode of the second input transistor T1 is electrically connected to the first input signal terminal GI, and a second electrode of the second input transistor T1 is electrically connected to a first node N1.

For example, the second input transistor T1 is configured to be turned on under the control of the first clock signal, and transmits the first input signal to the first node N1.

For example, as shown in FIG. 7, a control electrode of the first control transistor T2 is electrically connected to the first node N1, a first electrode of the first control transistor T2 is electrically connected to the first clock signal terminal CK1, and a second electrode of the first control transistor T2 is electrically connected to the second node N2.

For example, the first control transistor T2 is configured to be turned on under control a voltage of the first node N1, and transmits the first clock signal to the second node N2.

In some examples, as shown in FIG. 7, a control electrode of the second control transistor T6 is electrically connected to the second node N2, a first electrode of the second control transistor T6 is electrically connected to the second voltage signal terminal VH1, and a second electrode of the second control transistor T6 is electrically connected to a third node N3.

For example, the first control transistor T2 is configured to be turned on under the control of the voltage of the first node N1, and transmits the first clock signal to the second node N2.

In some examples, as shown in FIG. 7, a control of the third control transistor T7 is electrically connected to the second clock signal terminal CB1, a first electrode of the third control transistor T7 is electrically connected to the first node N3, and a second electrode of the third control transistor T7 is electrically connected to the first node N1.

For example, the third control transistor T7 is configured to be turned on under control of the second clock signal, and transmits a signal of the third node N3 (e.g., the second voltage signal) to the first node N1.

In some examples, as shown in FIG. 7, a control electrode of the fourth control transistor T8 is electrically connected to the first voltage signal terminal VL1, a first electrode of the fourth control transistor T8 is electrically connected to the first node N1, and a second electrode of the fourth control transistor T8 is electrically connected to a fourth node N4.

For example, the fourth control transistor T8 is configured to be turned on under control of the first voltage signal, and transmits a signal of the first node N1 (e.g., the first input signal) to the fourth node N4.

In some examples, as shown in FIG. 7, a control electrode of the first output transistor T4 is electrically connected to the second node N2, a first electrode of the first output transistor T4 is electrically connected to the second voltage signal terminal VH1, and a second electrode of the first output transistor T4 is electrically connected to the scan signal output terminal GO. A first electrode plate of the first capacitor C1 is electrically connected to the second voltage signal terminal VH1, and a second electrode of the first capacitor C1 is electrically connected to the second node N2.

For example, the first output transistor T4 is configured to be turned on under control of a voltage of the second node N2, and transmits the second voltage signal to the scan signal terminal GO. The first capacitor C1 is configured to maintain the voltage of the second node N2.

In some examples, as shown in FIG. 7, a control electrode of the third output transistor T5 is electrically connected to the fourth node N4, a first electrode of the third output transistor T5 is electrically connected to the second clock signal terminal CB1, and a second electrode of the third output transistor T5 is electrically connected to the scan signal output terminal GO. A first electrode plate of the second capacitor C2 is electrically connected to the scan signal output terminal GO, and a second electrode plate of the second capacitor C2 is electrically connected to the fourth node N4.

For example, the third output transistor T5 is configured to be turned on under control of a voltage of the fourth node N4, and transmits the second clock signal to the scan signal output terminal GO. The second capacitor C2 is configured to maintain the voltage of the fourth node N4.

Figure 8:
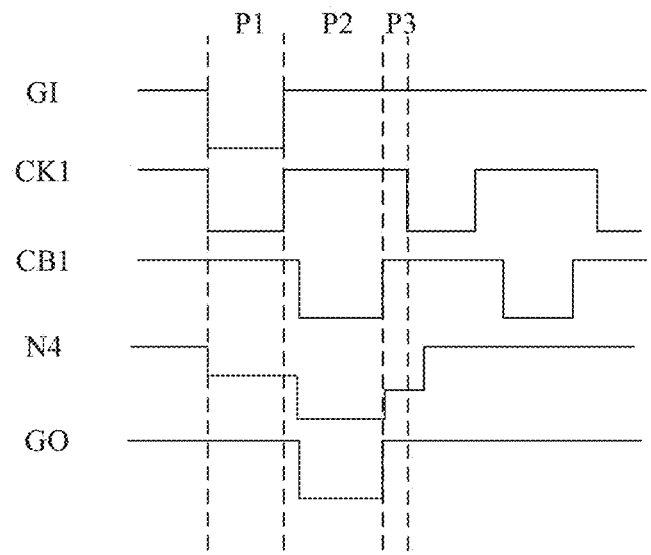
FIG. 8 is a driving timing diagram of a scan circuit, in accordance with some embodiments of the present disclosure.

With reference to the timing diagram shown in FIG. 8, the operation principle of the scan circuit 11 will be described below by taking the structure of the scan circuit 11 shown in FIG. 7. In FIG. 8, GI represents the first input signal transmitted by the first input signal terminal, CK1 represents the first clock signal transmitted by the first clock signal terminal, CB1 represents the second clock signal transmitted by the second clock signal terminal, GO represents the scan signal transmitted by the scan signal output terminal, and N4 represents the voltage of the fourth node.

For example, as shown in FIG. 8, the operation process of the scan circuit 11 includes: an input period P1, an output period P2 and a buffer period P3.

For example, as shown in FIGS. 7 and 8, in the input period P1, the first clock signal is at a low level, and the second clock signal is at a high level. For example, in this period, a voltage value of the second clock signal is equal to a voltage value of the second voltage signal. The first input signal is at a low level, and a voltage value of the first input signal may be represented by Vin. For example, in this period, the voltage value of the first input signal is equal to a voltage value of the first voltage signal.

For example, the second input transistor T1 is turned on under the control of the first clock signal, and transmits the first input signal to the first node N1. When the second input transistor T1 transmits the first input signal, there is a loss caused by a threshold voltage of the second input transistor T1. Thus, the voltage of the first node N1 is (Vin−Vth1), i.e., (VL−Vth1). Vth1 represents the threshold value of the second input transistor T1. The fourth control transistor T8 is turned on under the control of the first voltage signal, and transmits the voltage of the first node N1, which is (VL−Vth1), to the fourth node N4. For example, a threshold voltage of the fourth control transistor T8 is Vth8. Similarly, when the fourth control transistor T8 transmits the signal, there is a loss caused by the threshold voltage of the fourth control transistor T8. Thus, the voltage of the fourth node N4 is (VL−VthN1), and VthN1 is the smaller of Vth1 and Vth8. The third output transistor T5 may be turned on under the control of the voltage of the fourth node N4, and transmits the second clock signal to the scan signal output terminal GO as the output signal.

For example, the first input transistor T3 is turned on under the control of the first clock signal, and transmits the first voltage signal VL1 to the second node N2. Since the voltage of the first node N1 is (VL−Vth1), the first control transistor T2 is turned on under control of the voltage of the first node N1, and transmits the first clock signal to the second node N2. For example, a threshold voltage of the first control transistor T2 is Vth2, and a threshold voltage of the first input transistor T3 is Vth3; if Vth3 is less than (Vth2+Vth1) (Vth3<(Vth2+Vth1)), the voltage of the second node N2 is (VL−Vth1−Vth2); if Vth3 is greater than (Vth1+Vth2) (Vth3>(Vth1+Vth2)), the voltage of the second node N2 is (VL−Vth3). In this case, the first output transistor T4 and the first control transistor T6 are both turned on under the control of the voltage of the second node N2. The third control transistor T7 is turned off under the control of the second clock signal.

Since the second clock signal is at a high level, and the second voltage signal is at a high level, the scan signal is at a high level and the voltage thereof is VH in the input period P1.

For example, as shown in FIGS. 7 and 8, in the output period P2, the first clock signal is at a high level, and the second clock signal is at a low level. For example, in this period, the voltage value of the second clock signal is equal to the voltage value of the first voltage signal.

For example, the second input transistor T1 and the first input transistor T3 are both turned off under the control of the first clock signal. The voltage of the first node N1 is still (VL−VthN1). The first control transistor T2 is turned on under the control of the voltage of the first node N1, and transmits the first clock signal to the second node N2. That is, the voltage of the second node N2 is VH. Therefore, the first output transistor T4 and the second control transistor T6 are both turned off under control of the voltage of the second node N2.

For example, the third output transistor T5 is turned on under the control of the voltage of the fourth node N4, and transmits the second clock signal to the scan signal output terminal GO as the output signal. In the input period P1, a voltage of the first electrode plate of the second capacitor C2 is VH, and a voltage of the second electrode plate of the second capacitor C2 is (VL−VthN1). In the output stage P2, the voltage of the first electrode plate of the second capacitor C2 changes to VL. Due to the bootstrap effect of the second capacitor C2, the voltage of the second electrode plate of the second capacitor C2 changes to (2VL−VthN1−VH). That is, the voltage of the fourth node N4 changes to (2VL−VthN1−VH). In this case, the fourth control transistor T8 is turned off, the third output transistor T5 may be turned on completely under the control of the voltage of the fourth node N4, and the voltage of the scan signal is VL.

For example, as shown in FIGS. 7 and 8, in the buffer period P3, the first clock signal is at a high level, the second clock signal is at a high level, and the first input signal is at a high level.

For example, the third output transistor T5 is turned on under the control of the voltage of the fourth node N4, and transmits the second clock signal to the scan signal output terminal GO as the output signal. In this case, the voltage of the scan signal is VH. Due to the bootstrap effect of the second capacitor C2, the voltage of the fourth node N4 changes to (VL−VthN1).

For example, the second input transistor T1 and the first input transistor T3 are both turned off under the control of the voltage of the first clock signal. Since the voltage of the fourth node N4 changes to (VL−VthN1), the fourth control transistor T8 is turned on under the control of the first voltage signal, and the voltage of the first node N1 is also (VL−VthN1). The first control transistor T2 is turned on under the control of the voltage of the first node N1, and transmits the first clock signal to the second node N2. The voltage of the second node N2 is VH. Therefore, the first output transistor T4 and the first control transistor T6 are both turned off under the control of the voltage of the second node N2.

In some embodiments, as shown in FIG. 9, the reset circuit 12 includes: a third input transistor R3, a fourth input transistor R1, a fifth control transistor R2, a sixth control transistor R6, a seventh control transistor R7, and an eighth control transistor R8, the second output transistor R4, the fourth output transistor R5, a third capacitor C10 and a fourth capacitor C20.

In some examples, as shown in FIG. 9, a control electrode of the third input transistor R3 is electrically connected to the third clock signal terminal CK2, a first electrode of the third input transistor R3 is electrically connected to the third voltage signal terminal VL2, and a second electrode of the third input transistor R3 is electrically connected to a sixth node N6.

For example, the third input transistor M3 is configured to be turned on under control of the third clock signal, and transmits the third voltage signal to the sixth node N6.

In some examples, as shown in FIG. 9, a control electrode of the fourth input transistor R1 is electrically connected to the third clock signal terminal CK2, a first electrode of the fourth input transistor R1 is electrically connected to the second input signal terminal RI, and a second electrode of the fourth input transistor R1 is electrically connected to a fifth node N5.

For example, the fourth input transistor R1 is configured to be turned on under the control of the third clock signal, and transmits the second input signal to the fifth node N5.

In some examples, as shown in FIG. 9, a control electrode of the fifth control transistor R2 is electrically connected to the fifth node N5, a first electrode of the fifth control transistor R2 is electrically connected to the third clock signal terminal CK2, and a second electrode of the fifth control transistor R2 is electrically connected to the sixth node N6.

For example, the fifth control transistor R2 is configured to be turned on under the control of the voltage of the fifth node N5, and transmits the third clock signal to the sixth node N6.

In some examples, as shown in FIG. 9, a control electrode of the sixth control transistor R6 is electrically connected to the sixth node N6, a first electrode of the sixth control transistor R6 is electrically connected to the fourth voltage signal terminal VH2, and a second electrode of the sixth control transistor R6 is electrically connected to a seventh node N7.

For example, the sixth control transistor R6 is configured to be turned on under control of a voltage of the sixth node N6, and transmits the fourth voltage signal to the seventh node N7.

In some examples, as shown in FIG. 9, a control electrode of the seventh control transistor R7 is electrically connected to the fourth clock signal terminal CB2, a first electrode of the seventh control transistor R7 is electrically connected to the seventh node N7, and a second electrode of the seventh control transistor R7 is electrically connected to the fifth node N5.

For example, the seventh control transistor T7 is configured to be turned on under control of the fourth clock signal, and transmits a voltage of the seventh node N7 to the fifth node N5.

In some examples, as shown in FIG. 9, a control electrode of the eighth control transistor R8 is electrically connected to the third voltage signal terminal VL2, a first electrode of the eighth control transistor R8 is electrically connected to the fifth node N5, and a second electrode of the eighth control transistor R8 is electrically connected to an eighth node N8.

For example, the eighth control transistor R8 is configured to be turned on under control of the third voltage signal, and transmits the voltage of the fifth node N5 to the eighth node N8.

In some examples, as shown in FIG. 9, a control electrode of the second output transistor R4 is electrically connected to the sixth node N6, a first electrode of the second output transistor R4 is electrically connected to the fourth voltage signal terminal VH2, and a second electrode of the second output transistor R4 is electrically connected to the reset signal output terminal RO. A first electrode plate of the third capacitor C10 is electrically connected to the fourth voltage signal terminal VH2, and a second electrode plate of the third capacitor C10 is electrically connected to the sixth node N6.

For example, the second output transistor R4 is configured to be turned on under the control of the voltage of the sixth node N6, and transmits the fourth voltage signal to the reset signal output terminal RO. The third capacitor C10 is configured to maintain the voltage of the sixth node N6.

In some examples, as shown in FIG. 9, a control electrode of the fourth output transistor R5 is electrically connected to the eighth node N8, a first electrode of the fourth output transistor R5 is electrically connected to the fourth clock signal terminal CB2, and a second electrode of the fourth output transistor R5 is electrically connected to the reset signal output terminal RO. A first electrode plate of the fourth capacitor C20 is electrically connected to the reset signal output terminal RO, and a second electrode plate of the fourth capacitor C20 is electrically connected to the eighth node N8.

For example, the fourth output transistor R5 is configured to be turned on under control of a voltage of the eighth node N8, and transmits the fourth clock signal to the reset signal output terminal RO. The fourth capacitor C20 is configured to maintain the voltage of the eighth node N8.

For example, the structure of the reset circuit 12 is the same as the structure of the scan circuit 11, and the operation principle of the reset circuit 12 is the same as or similar to the operation principle of the reset circuit 12. As for the operation principle of the reset circuit 12, reference may be made to the operation principle of the scan circuit 11 in the above embodiments, and details will not be repeated here.

Some embodiments of the present disclosure further provide a scan driving circuit 100. As shown in FIG. 5, the scan driving circuit 100 includes a plurality of shift registers 10 according to the above embodiments.

In some examples, scan circuits 11 in the plurality of shift registers 10 are cascaded with one another, and reset circuits 12 in the plurality of shift registers 10 are cascaded with one another. There is no cascade relationship between the scan circuits 11 and the reset circuits 12.

For example, a scan signal output terminal GO of a scan circuit 11 in an a-th shift register is electrically connected to a first input signal terminal GI of a scan circuit 11 in an (a+1)-th shift register. That is, a scan signal output by the scan circuit 11 in the a-th shift register may be used as a first input signal of the scan circuit 11 in the (a+1)-th shift register. Here, a is a positive integer.

For example, a reset signal output terminal RO of a reset circuit 12 in the a-th shift register is electrically connected to a second input terminal signal terminal RI of a reset circuit 12 in the (a+1)-th shift register. That is, a reset signal output by the reset circuit 12 in the a-th shift register may be used as a second input signal of the reset circuit 12 in the (a+1)-th shift register.

In some examples, as shown in FIG. 5, along a column direction Y, the scan circuits 11 in the plurality of shift registers 10 are arranged in sequence, for example, arranged in a line. Along the column direction, the reset circuits 12 in the plurality of shift registers 10 are arranged in sequence, for example, arranged in a line. In this way, the scan circuits 11 and the reset circuits 12 may be arranged regularly, which facilitates the wiring layout, and is conducive to reducing the area occupied by the shift registers 10 and the scan driving circuit 100.

In some embodiments, as shown in FIG. 2, the scan driving circuit further includes: a first voltage signal line VGL1, a second voltage signal line VGH1, a third voltage signal line VGL2 and a fourth voltage signal line VGH2.

For example, the first voltage signal line VGL1 extends along the column direction Y, and is electrically connected to the first voltage signal terminal VL1 of the scan circuit 11. The first voltage signal line VGL1 provides the first voltage signal for the first voltage signal terminal VL1 of the scan circuit 11.

For example, the second voltage signal line VGH1 extends along the column direction Y, and is electrically connected to the second voltage signal terminal VH1 of the scan circuit 11. The second voltage signal line VGH1 provides the second voltage signal for the second voltage signal terminal VH1 of the scan circuit 11.

For example, the third voltage signal line VGL2 extends along the column direction Y, and is electrically connected to the third voltage signal terminal VL2 of the reset circuit 12. The third voltage signal line VGL2 provides the third voltage signal for the third voltage signal terminal VL2 of the reset circuit 12.

For example, the fourth voltage signal line VGH2 extends along the column direction Y, and is electrically connected to the fourth voltage signal terminal VH2 of the reset circuit 12. The fourth voltage signal line VGH2 provides the fourth voltage signal for the fourth voltage signal terminal VH2 of the reset circuit 12.

Since the first voltage signal line VGL1, the second voltage signal line VGH1, the third voltage signal line VGL2 and the fourth voltage signal line VGH2 all extend along the column direction Y, the area and space occupied by the scan driving circuit 100 on the display substrate 1000 may be saved, which facilitates the narrow bezel of the display substrate 1000.

Figure 10:
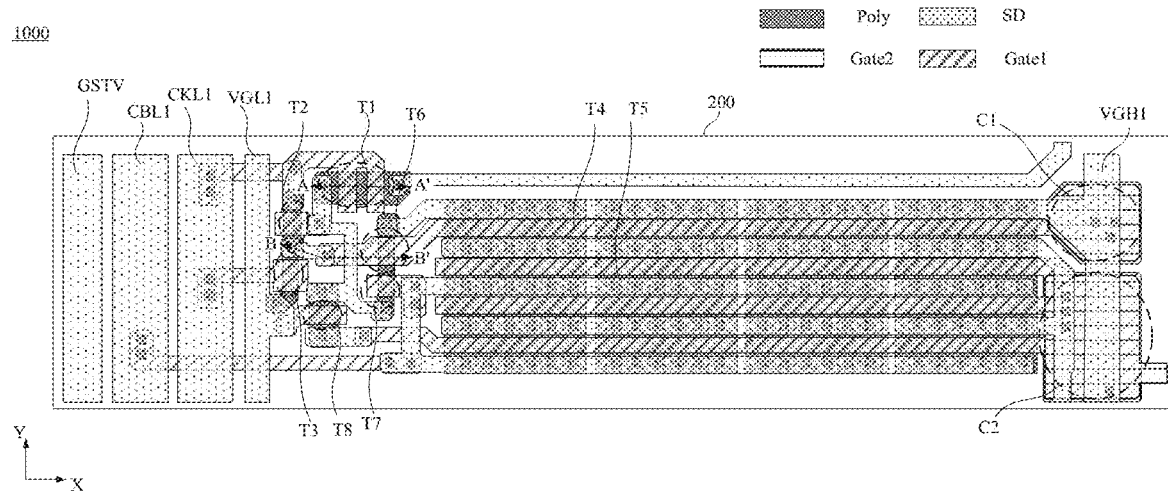
FIG. 10 is a top view of a part of a display substrate, in accordance with some embodiments of the present disclosure.

For example, as shown in FIGS. 2, 10 and 18, the scan circuit 11 is disposed between the first voltage signal line VGL1 and the second voltage signal line VGH1, and the reset circuit 12 is disposed between the third voltage signal line VGL2 and the fourth voltage signal line VGH2.

By arranging the first voltage signal line VGL1 and the second voltage signal line VGH1 on two sides of the scan circuit 11 (e.g., in the row direction X), and arranging the third voltage signal line VGL2 and the fourth voltage signal line VGH2 on two sides of the reset circuits 12, it may be possible to avoid a parasitic capacitance developed by the first voltage signal line VGL1 and the second voltage signal line VGH1, and avoid a parasitic capacitance developed by the third voltage signal line VGL2 and the fourth voltage signal line VGH2; in addition, the first voltage signal line VGL1, the second voltage signal line VGH1, the third voltage signal line VGL2, the fourth voltage signal line VGH2 may be arranged compactly. Therefore, it is beneficial to save the wiring space, facilitate the signal transmission, and realize the narrow bezel of the display substrate 1000.

In some embodiments, as shown in FIGS. 2, 10 and 18, the second voltage signal line VGH1 and the third voltage signal line VGL2 are disposed between the scan circuit 11 and the reset circuit 12. In this case, the first voltage signal line VGL1 is disposed on a side of the scan circuit 11 away from the plurality of rows of sub-pixels, and the fourth voltage signal line VGH2 is disposed on a side of the reset circuit 12 proximate to the plurality of rows of sub-pixels.

In this way, it may be possible to reduce a distance between the second voltage signal line VGH1 and the first electrode of the first output transistor T4 in the scan circuit 11, reduce a distance between the third voltage signal line VGL2 and the first electrode of the third input transistor R3 in the reset circuit 12, reduce a distance between the first voltage signal VGL1 and the first electrode of the first input transistor T3 in the scan circuit 11, and reduce a distance between the fourth voltage signal line VGH2 and the first electrode of the second output transistor R4 in the reset circuit 12. Therefore, it may be possible not only to simplify the wiring difficulty, but also to save the area and space occupied by the scan driving circuit 100. As a result, it is conducive to realizing the narrow bezel of the display substrate 1000.

In some embodiments, as shown in FIG. 5, the scan driving circuit 100 further includes: a first clock signal line CKL1, a second clock signal line CBL1, a third clock signal line CKL2 and a fourth dock signal line CBL2.

For example, the first clock signal line CKL1 extends along the column direction Y, and is electrically connected to a first clock signal terminal CK1 of a (2m−1)-th scan circuit 11 and a second clock signal terminal CB1 of a 2m-th scan circuit 12, m being a positive integer.

For example, as shown in FIG. 5, the first clock signal line CKL1 is electrically connected to the first clock signal terminal CK1 of the first scan circuit 11 (i.e., m=1), the first clock signal terminal CK1 of the third scan circuit 11 (i.e., m=2), the first clock signal terminal CK1 of the fifth scan circuit 11 (i.e., m=3), the first clock signal terminal CK1 of the seventh scan circuit 11 (i.e., m=4), and so on. The first clock signal line CKL1 is electrically connected to the second clock signal terminal CB1 of the second scan circuit 11 (i.e., m=1), the second clock signal terminal CB1 of the fourth scan circuit 11 (i.e., m=2), the second clock signal terminal CB1 of the sixth scan circuit 11 (i.e., m=3), the second clock signal terminal CB1 of the eighth scan circuit 11 (i.e., m=4), and so on.

For example, the second clock signal line CBL1 extends along the column direction Y, and is electrically connected to a second clock signal terminal CB1 of the (2m−1)-th scan circuit and a first clock signal terminal CK1 of the 2m-th scan circuit, m being a positive integer.

For example, as shown in FIG. 5, the second clock signal line CBL1 is electrically connected to the second clock signal terminal CB1 of the first scan circuit 11 (i.e., m=1), the second clock signal terminal CB1 of the third scan circuit 11 (i.e., m=2), the second clock signal terminal CB1 of the fifth scan circuit 11 (i.e., m=3), the second clock signal terminal CB1 of the seventh scan circuit 11 (i.e., m=4), and so on. The second clock signal line CBL1 is electrically connected to the first clock signal terminal CK1 of the second scan circuit 11 (i.e., m=1), the first clock signal terminal CK1 of the fourth scan circuit 11 (i.e., m=2), and the first clock signal terminal CK1 of the sixth scan circuit 11 (i.e., m=3), the first clock signal terminal CK1 of the eighth scan circuit 11 (i.e., m=4), and so on.

For example, the third clock signal line CKL2 extends along the column direction Y, and is electrically connected to a third clock signal terminal CK2 of a (2m−1)-th reset circuit 12 and a fourth clock signal terminal CB2 of a 2m-th reset circuit 12, m being a positive integer.

For example, as shown in FIG. 5, the third dock signal line CKL2 is electrically connected to the third clock signal terminal CK2 of the first reset circuit 12 (i.e., m=1), the third clock signal terminal CK2 of the third reset circuit 12 (i.e., m=2), the third clock signal terminal CK2 of the fifth reset circuit 12 (i.e., m=3), the third clock signal terminal CK2 of the seventh reset circuit 12 (i.e., m=4), and so on. The third dock signal line CKL2 is electrically connected to the fourth clock signal terminal CB2 of the second reset circuit 12 (i.e., m=1), the fourth dock signal terminal CB2 of the fourth reset circuit 12 (i.e., m=2), the fourth clock signal terminal CB2 of the sixth reset circuit 12 (i.e., m=3), the fourth clock signal terminal CB2 of the eighth reset circuit 12 (i.e., m=4), and so on.

For example, the fourth clock signal line CBL2 extends along the column direction Y, and is electrically connected to a fourth clock signal terminal CB2 of the (2m−1)-th reset circuit 12 and a third dock signal terminal CK2 of the 2m-th reset circuit 12, m being a positive integer.

For example, as shown in FIG. 5, the fourth clock signal line CBL2 is electrically connected to the fourth clock signal terminal CB2 of the first reset circuit 12 (i.e., m=1), the fourth dock signal terminal CB2 of the third reset circuit 12 (i.e., m=2), the fourth clock signal terminal CB2 of the fifth reset circuit 12 (i.e., m=3), the fourth clock signal terminal CB2 of the seventh reset circuit 12 (i.e., m=4), and so on. The fourth clock signal line CBL2 is electrically connected to the third clock signal terminal CK2 of the second reset circuit 12 (i.e., m=1), the third clock signal terminal CK2 of the fourth reset circuit 12 (i.e., m=2), the third clock signal terminal CK2 of the sixth reset circuit 12 (i.e., m=3), the third clock signal terminal CK2 of the eighth reset circuit 12 (i.e., m=4), and so on.

As shown in FIGS. 10 and 18, the first dock signal line CKL1, the second clock signal line CBL1, the third clock signal line CKL2 and the fourth clock signal line CBL2 all extend along the column direction Y, which is conducive to reducing the area and space occupied by the scan driving circuit 100, and thus facilitating the narrow bezel of the display substrate 1000.

In some examples, the first clock signal line CKL1 and the second clock signal line CBL1 are disposed on a side of the scan circuit 11 away from the reset circuit 12. The third clock signal line CKL2 and the fourth clock signal line CBL2 are disposed on a side of the reset circuit 12 proximate to the scan circuit 11.

For example, as shown in FIGS. 2, 10 and 18, the first clock signal line CKL1, the second clock signal line CBL1 and the first voltage signal line VGL1 are disposed on a same side of the scan circuit 11. For example, the first voltage signal line VGL1 is located between the first clock signal line CKL1 and the scan circuit 11, and is closer to the scan circuit 12. In this way, it may be possible to reduce a length of a connection line connecting the control electrode of the first control transistor T2 to the first clock signal line CKL1, reduce a length of a connection line connecting the control electrode of the first input transistor T3 to the first clock signal line CKL1, reduce a length of a connection line connecting the control electrode of the third control transistor T7 to the second clock signal line CBL1, and reduce a length of a connection line connecting the first electrode of the first input transistor T3 to the first voltage signal line VGL1. Thus, it may be possible to reduce the area and space occupied by the scan circuit 11, reduce the area and space occupied by the scan driving circuit 100 in the display substrate 1000, and realize the narrow bezel of the display substrate 1000. The third clock signal line CKL2, the fourth clock signal line CBL2 and the third voltage signal line VGL2 are disposed on a same side of the reset circuit 12. For example, the third voltage signal line VGL2 is located between the third clock signal line CKL2 and the reset circuit 12, and is closer to the reset circuit 12. In this way, it may be possible to reduce a length of a connection line connecting the control electrode of the fifth control transistor R2 to the third clock signal line CKL2, reduce a length of a connection line connecting the control electrode of the third input transistor R3 to the third clock signal line CKL2, reduce a length of a connection line connecting the first electrode of the third input transistor R3 to the third voltage signal line VGL2. Thus, it may be possible to save the area and space occupied by the reset circuit 12, reduce the area and space occupied by the scan driving circuit 100 in the display substrate 1000, and realize the narrow bezel of the display substrate 1000.

In some embodiments, as shown in FIG. 5, the scan driving circuit 100 further includes a first initial signal line GSTV and a second initial signal line RSTV.

For example, the first initial signal line GSTV extends along the column direction Y, and is electrically connected to first input signal terminals GI of scan circuits 11 in first n shift registers 10 in the plurality of shift registers 10, n being a positive integer.

For example, n is equal to 1 (n=1), and the first initial signal line GSTV is electrically connected to the first input signal terminal GI of the scan circuit 11 in the first shift register in the plurality of shift registers 10. A first initial signal transmitted by the first initial signal line GSTV may be used as the first input signal of the scan circuit 11 in the first shift register.

For example, the second initial signal line RSTV extends along the column direction Y, and is electrically connected to second input signal terminals RI of reset circuits 12 in first i shift registers 10 in the plurality of shift registers, i being a positive integer.

For example, i is equal to 1 (i=1), and the second initial signal line RSTV is electrically connected to the second input signal terminal RI of the reset circuit 12 in the first shift register 10 in the plurality of shift registers 10. A second initial signal transmitted by the second initial signal line RSTV may be used as the second input signal of the reset circuit 12 in the first shift register.

In some examples, as shown in FIGS. 2, 10 and 18, the first initial signal line GSTV is disposed on the side of the scan circuit 11 away from the reset circuit 12, and the second initial signal line RSTV is disposed on the side of the reset circuit 12 proximate to the scan circuit 11.

In this way, a distance between the first electrode of the second input transistor T1 of the scan circuit 11 and the first initial signal line GSTV is relatively small, and a length of a connection line connecting the first electrode of the second input transistor T1 to the first initial signal line GSTV may be reduced; a distance between the first electrode of the fourth input transistor R1 of the reset circuit 12 and the second initial signal line RSTV is relatively small, and a length of a connection line connecting the first electrode of the fourth input transistor R1 to the second initial signal line RSTV may be reduced. Therefore, it may be possible to reduce the area and space occupied by the scan driving circuit 100 in the display substrate 1000, and realize the narrow bezel of the display substrate 1000.

Figure 3:
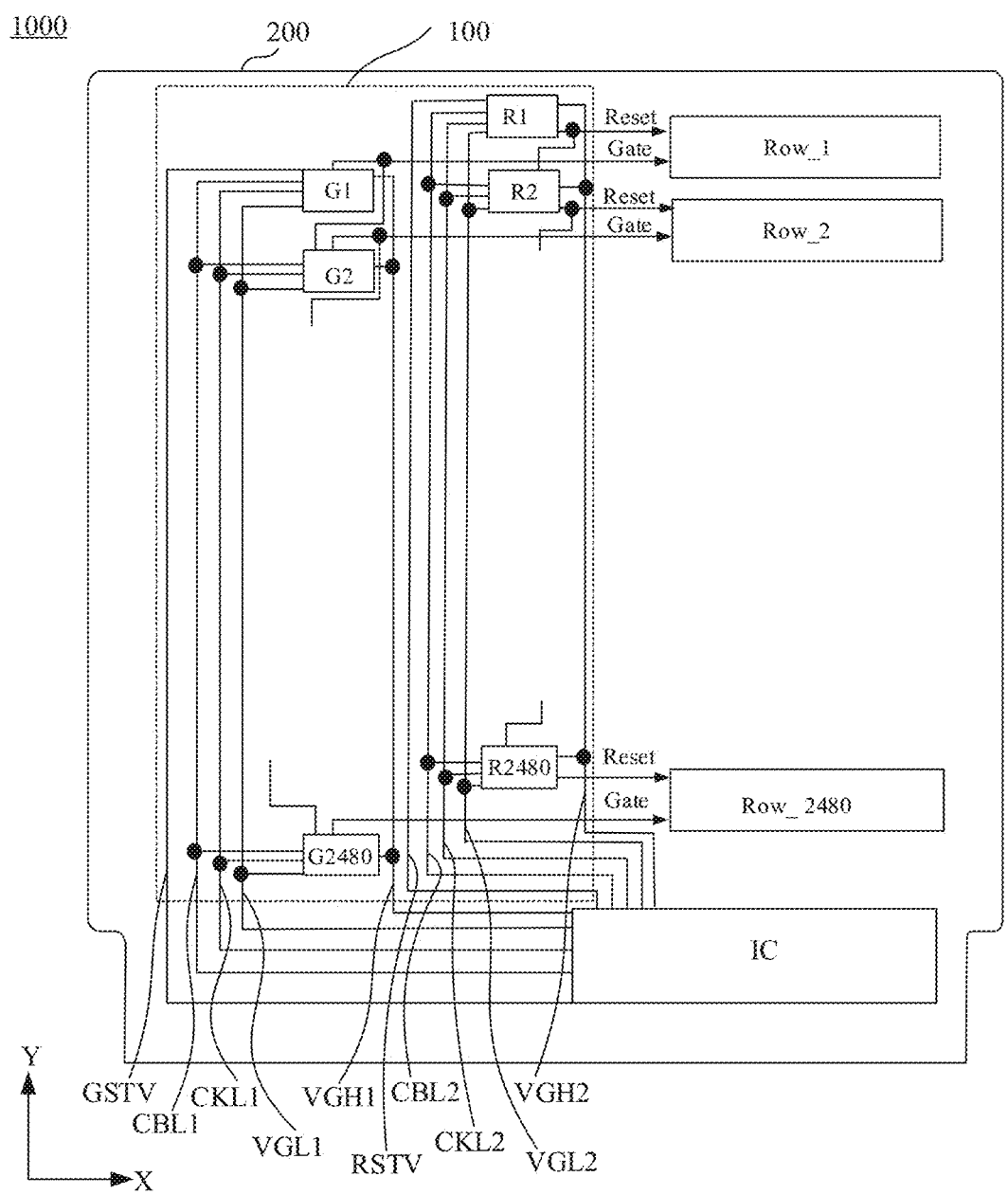
FIG. 3 is a structural diagram of another display substrate, in accordance with some embodiments of the present disclosure.

In some examples, as shown in FIG. 3, there is one scan driving circuit 100 in the display substrate 1000. In this case, the one scan driving circuit 100 is located on one side of the display substrate.

In some other examples, as shown in FIG. 4, there are two scan driving circuits 100 in the display substrate 1000. In this case, the two scan driving circuits 100 are located on two opposite sides of the plurality of rows of sub-pixels Row, respectively. Based on this, the two scan driving circuits 100 may operate alternately to provide the sub-pixels with scan signals and reset signals, which is conducive to reducing the load of the scan driving circuit 100 and improving the service life of the scan driving circuit 100.

It will be noted that, as shown in FIGS. 10 to 24, the scan driving circuit 100 may be composed of a plurality of layers that are stacked, and each layer has pattern(s).

In some embodiments, as shown in FIGS. 10, 13 to 16, and 20 to 23, the display substrate 1000 includes a semiconductor layer Poly disposed on the substrate 200, and a first gate conductive layer Gate1 disposed on a side of the semiconductor layer Poly away from the substrate 200. A material of the semiconductor layer Poly may include amorphous silicon, monocrystalline silicon, polycrystalline silicon or a metal oxide semiconductor material.

Figure 13:
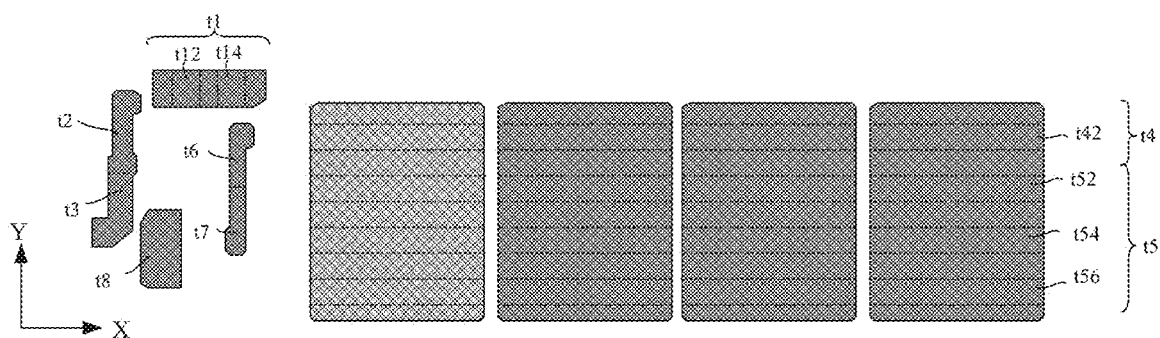
FIG. 13 is a top view of a part of a semiconductor layer in a scan circuit, in accordance with some embodiments of the present disclosure.
Figure 14:
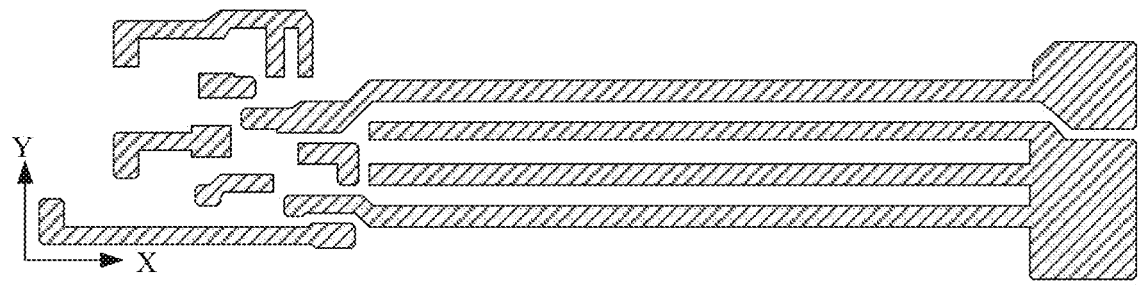
FIG. 14 is a top view of a part of a first gate conductive layer in a scan circuit, in accordance with some embodiments of the present disclosure.
Figure 15:
FIG. 15 is a top view of a part of a second gate conductive layer in a scan circuit, in accordance with some embodiments of the present disclosure.
Figure 16:
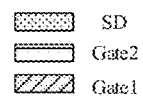
FIG. 16 is a top view of a part of some layers in a scan circuit, in accordance with some embodiments of the present disclosure.
Figure 16:
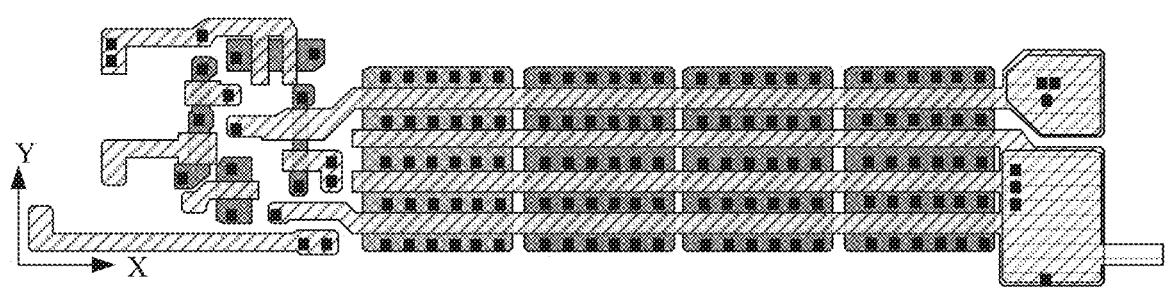
Figure 20:
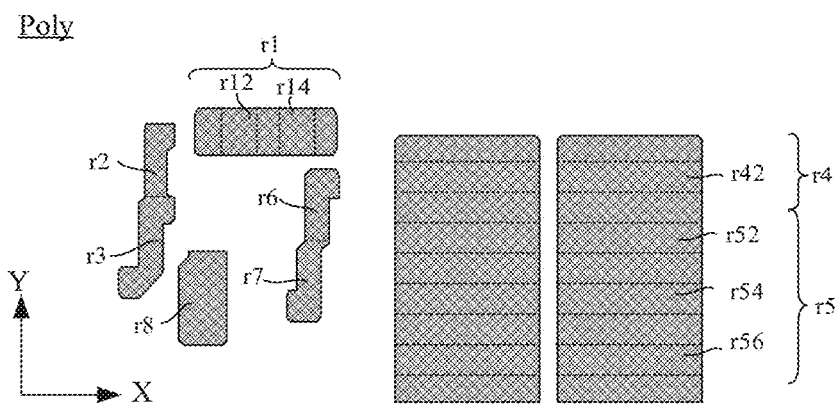
FIG. 20 is a top view of a part of a semiconductor layer in a reset circuit, in accordance with some embodiments of the present disclosure.
Figure 21:
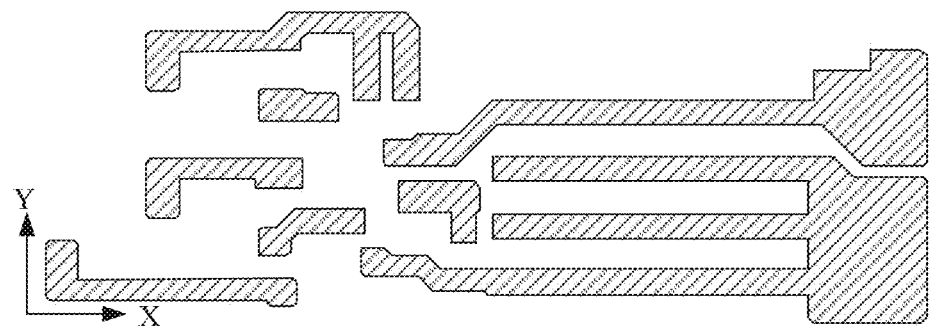
FIG. 21 is a top view of a part of a first gate conductive layer in a reset circuit, in accordance with some embodiments of the present disclosure.
Figure 22:
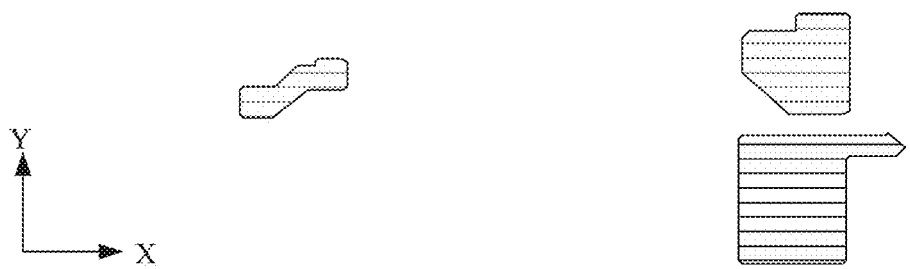
FIG. 22 is a top view of a part of a second gate conductive layer in a reset circuit, in accordance with some embodiments of the present disclosure.
Figure 23:
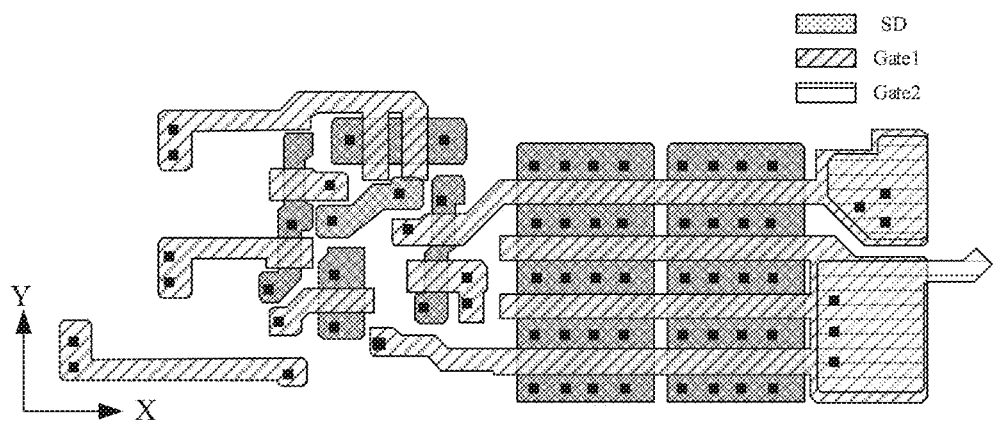
FIG. 23 is a top view of a part of some layers in a reset circuit, in accordance with some embodiments of the present disclosure.
Figure 24:
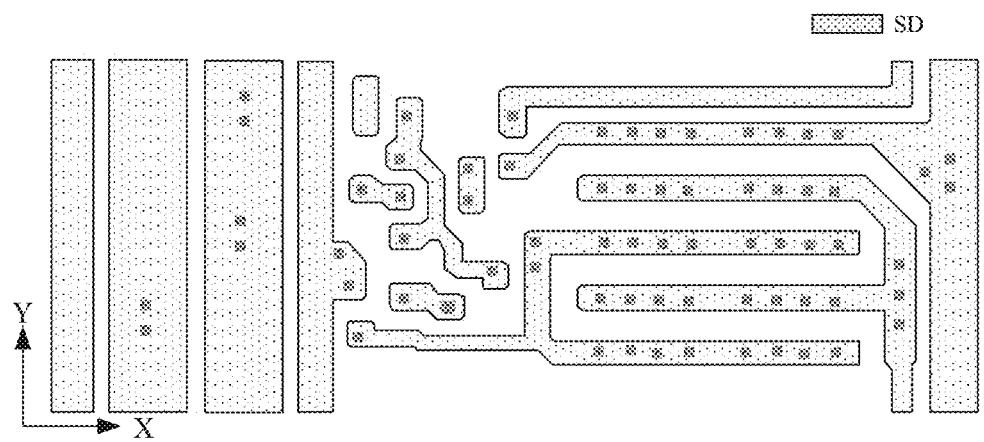
FIG. 24 is a top view of a part of some other layers in a reset circuit, in accordance with some embodiments of the present disclosure.

For example, in the shift register 10, the first output transistor T4 of the scan circuit 11 includes a first active layer t4, and the first active layer t4 includes a first channel portion t42 (as shown in FIG. 13); the second output transistor R4 of the reset circuit includes a second active layer r4, and the second active layer r4 includes a second channel portion r42 (as shown in FIG. 20).

For example, the first active layer t4 and the second active layer r4 are both located in the semiconductor layer Poly. That is, the first active layer t4 and the second active layer r4 are arranged in a same layer.

The term "same layer" as mentioned in the embodiments of the present disclosure refers to a layer structure with specific patterns formed by performing a patterning process on a film by using a same mask after the film is formed by using a same film-forming process. Depending on the different specific patterns, a patterning process may include several exposure, development or etching processes, the specific patterns in the formed layer structure may be continuous or discontinuous, and these specific patterns may also be at different heights or have different thicknesses. In this way, the first active layer t4 and the second active layer r4 may be fabricated simultaneously, which is conducive to simplifying the manufacturing process of the display substrate 1000.

It will be noted that, an orthographic projection of the semiconductor layer Poly on the substrate 200 overlaps with an orthographic projection of the first gate conductive layer Gate1 on the substrate 200. A channel portion of each transistor is composed of a portion of the semiconductor layer Poly covered by the first gate conductive layer Gate1.

A portion of a first electrode or a second electrode of each transistor is composed of a conductive portion, which is a portion of the semiconductor layer Poly that is not covered by the first gate conductive layer Gate1. The channel portion has a channel length and a channel width. For example, the channel length of the channel portion refers to a distance between the first electrode and the second electrode of the transistor. The channel width of the channel portion refers to a dimension of the channel portion in a direction perpendicular to a direction pointing from the first electrode of the transistor to the second electrode of the transistor.

For example, the channel width of the first channel portion t42 is greater than or equal to the channel width of the second channel portion r42.

For example, as shown in FIGS. 13 and 20, the channel width of the first channel portion t42 may be greater than the channel width of the second channel portion r42. This means that a dimension of the first channel portion t42 along the row direction X is greater than a dimension of the second channel portion r42 along the row direction X.

In this case, a high operation current may be obtained by increasing the channel width of the first output transistor T4. The increase of the operation current represents the enhancement of the writing ability and retention ability. Therefore, the power consumption of the display substrate may be reduced.

For another example, the channel width of the first channel portion t42 may be equal to the channel width of the second channel portion r42.

For example, the third output transistor T5 of the scan circuit 11 includes a third active layer t5 (as shown in FIG. 13). The third active layer t5 includes third channel portions (t52, t54 and t56 as shown in FIG. 13). The fourth output transistor R5 of the reset circuit 12 includes a fourth active layer r5 (as shown in FIG. 20), and the fourth active layer r5 includes fourth channel portions (r52, r54, and r56 as shown in FIG. 20).

For example, the third active layer t5 and the fourth active layer r5 are both located in the semiconductor layer Poly. That is, the third active layer t5 and the fourth active layer r5 are arranged in a same layer. In this way, the third active layer t5 and the fourth active layer r5 may be fabricated simultaneously, which is conducive to simplifying the manufacturing process of the display substrate 1000.

For example, the channel width of the third channel portion is greater than or equal to the channel width of the fourth channel portion.

For example, as shown in FIGS. 13 and 20, the channel width of the third channel portion is greater than the channel width of the fourth channel portion. This means that a dimension of the third channel portion along the row direction X is greater than a dimension of the fourth channel portion along the row direction X.

In this case, a high operation current may be obtained by increasing the channel width of the third output transistor T5. The increase of the operation current represents the enhancement of the writing ability and retention ability. Therefore, the power consumption of the display substrate may be reduced.

For another example, the channel width of the fourth channel portion may be equal to the channel width of the third channel portion.

A direction of the channel width of the third channel portion and a direction of the channel width of the fourth channel portion may vary, which may be set according to actual situations.

For example, as shown in FIG. 13, the first active layer t4 and the third active layer t5 are arranged sequentially along the column direction Y. In this way, it may be possible to effectively reduce a spacing between the first active layer t4 and the third active layer t5 along the column direction Y, and reduce the area occupied by the scan driving circuit 100 on the display substrate 1000, and is conducive to realizing the narrow bezel of the display substrate 1000.

For example, as shown in FIG. 13, the first active layer t4 and the third active layer t5 are of an integral structure. For example, as shown in FIG. 13, the first active layer t4 may be composed of a plurality of rectangular blocks that are spaced apart, the third active layer t5 may also be composed of a plurality of rectangular blocks that are spaced apart, and a rectangular block of the first active layer t4 and a corresponding rectangular block of the third active layer t5 are integrally provided to form a new rectangular block.

In this way, there is no space between the first active layer t4 and the third active layer t5 in the column direction Y, a dimension of the first active layer t4 and a dimension of the third active layer t5 along the column direction Y may be reduced, and in turn, the area occupied by the first output transistor T4 and the third output transistor T5 may be reduced. As a result, the area occupied by the scan driving circuit 100 on the display substrate 1000 may be reduced, which facilitates the narrow bezel of the display substrate 1000.

For example, the second active layer r4 and the fourth active layer r5 are arranged sequentially along the column direction Y. In this way, it may be possible to effectively reduce a distance between the second active layer r4 and the fourth active layer r5 along the column direction Y, reduce the area occupied by the scan driving circuit 100 on the display substrate 1000, and facilitate the narrow bezel of the display substrate 1000.

For example, as shown in FIG. 20, the second active layer r4 and the fourth active layer r5 are of an integral structure.

For example, as shown in FIG. 20, the second active layer r4 may be composed of a plurality of rectangular blocks that are spaced apart, the fourth active layer r5 may also be composed of a plurality of rectangular blocks that are spaced apart, and a rectangular block of the second active layer r4 and a corresponding rectangular block of the fourth active layer r5 are integrally provided to form a new rectangular block.

In this way, there is no space between the second active layer r4 and the fourth active layer r5 in the column direction Y, a dimension of the second active layer r4 and a dimension of the fourth active layer r5 along the column direction Y may be reduced, and in turn, the area occupied by the second output transistor R4 and the fourth output transistor R5 may be reduced. As a result, the area occupied by the scan driving circuit 100 on the display substrate 1000 may be reduced, which facilitates the narrow bezel of the display substrate 1000.

In some embodiments, the first input transistor T3 of the scan circuit 11 in the display substrate 1000 includes a fifth active layer t3 (as shown in FIG. 13). The fifth active layer t3 is disposed on a side of the first active layer t4 away from the plurality of rows of sub-pixels.

For example, the first control transistor T2 of the scan circuit 11 includes a sixth active layer t2 (as shown in FIG. 13). The sixth active layer t2 is disposed on the side of the first active layer t4 away from the plurality of rows of sub-pixels.

For example, the second control transistor T6 of the scan circuit 11 includes a seventh active layer t6 (as shown in FIG. 13). In the row direction X, the seventh active layer t6 is disposed between the fifth active layer t3 and the first active layer t4.

For example, the third control transistor T7 of the scan circuit 11 includes an eighth active layer t7 (as shown in FIG. 13). In the row direction X, the eighth active layer t7 is disposed between the fifth active layer t3 and the first active layer t4.

For example, the fourth control transistor T8 of the scan circuit 11 includes a ninth active layer t8 (as shown in FIG. 13). The ninth active layer t8 is disposed between the fifth active layer t3 and the eighth active layer t7.

For example, the fifth active layer t3, the sixth active layer t2, the seventh active layer t6, the eighth active layer t7 and the ninth active layer t8 are all located in the semiconductor layer Poly.

For example, the fifth active layer t3, the sixth active layer t2, the seventh active layer t6, the eighth active layer t7 and the ninth active layer t8 are arranged in a same layer and made of a same material, which is conducive to reducing the process.

For example, a direction of the channel length of the fifth active layer t3, a direction of the channel length the sixth active layer t2, a direction of the channel length of the seventh active layer t6, a direction of the channel length of the eighth active layer t7 and a direction of the channel length of the ninth active layer t8 are the same as the column direction Y. In this way, it may be possible to reduce the dimension of each channel portion along the row direction X, reduce the area occupied by the scan driving circuit 100 on the display substrate 1000, and in turn realize the narrow bezel of the display substrate 1000.

In some examples, the fifth active layer t3 and the sixth active layer t2 are arranged sequentially along the column direction Y, and are of an integral structure.

In this way, since the fifth active layer t3 and the sixth active layer t2 are arranged sequentially along the column direction Y, it may be possible to reduce the dimensions of the fifth active layer t3 and the sixth active layer t2 along the row direction X, and reduce the area occupied by the fifth active layer t3 and the sixth active layer t2. The fifth active layer t3 and the sixth active layer t2 are of an integral structure, so that there is no gap between the fifth active layer t3 and the sixth active layer t2, the dimensions of the fifth active layer t3 and the sixth active layer t2 along the column direction Y may be reduced, and the area occupied by the fifth active layer t3 and the sixth active layer t2 may be reduced. Therefore, it may be possible to reduce the area occupied by the scan driving circuit 100 on the display substrate 1000, and in turn realize the narrow bezel of the display substrate 1000, and simplify the manufacturing process of the display substrate 1000.

In some examples, the seventh active layer t6 and the eighth active layer t7 are arranged sequentially along the column direction Y, and are of an integral structure.

In this way, since the seventh active layer t6 and the eighth active layer t7 are arranged sequentially along the column direction Y, it may be possible to reduce the dimensions of the seventh active layer t6 and the eighth active layer t7 along the row direction X, and reduce the area occupied by the seventh active layer t6 and the eighth active layer t7. The seventh active layer t6 and the eighth active layer t7 are of an integral structure, so that there is no gap between the seventh active layer t6 and the eighth active layer t7, the dimensions of the seventh active layer t6 and the eighth active layer t7 along the column direction Y may be reduced, and the area occupied by the seventh active layer t6 and the eighth active layer t7 may be reduced. Therefore, it may be possible to reduce the area occupied by the scan driving circuit 100 on the display substrate 1000, and in turn realize the narrow bezel of the display substrate 1000, and simplify the manufacturing process of the display substrate 1000.

In some examples, the third input transistor R3 of the reset circuit 12 includes a tenth transistor active layer r3 (as shown in FIG. 20). The tenth active layer r3 is disposed on a side of the second active layer r4 away from the plurality of rows of sub-pixels.

For example, the fifth control transistor R2 of the reset circuit 12 includes an eleventh active layer r2 (as shown in FIG. 20). The eleventh active layer r2 is disposed on the side of the second active layer r4 away from the plurality of rows of sub-pixels.

For example, the sixth control transistor R6 of the reset circuit 12 includes a twelfth active layer r6 (as shown in FIG. 20). In the row direction X, the twelfth active layer r6 is disposed between the tenth active layer r3 and the second active layer r4.

For example, the seventh control transistor R7 of the reset circuit 12 includes a thirteenth active layer r7 (as shown in FIG. 20). In the row direction X, the thirteenth active layer r7 is disposed between the tenth active layer r3 and the second active layer r4.

For example, the eighth control transistor R8 of the reset circuit 12 includes a fourteenth active layer r8 (as shown in FIG. 20). The fourteenth active layer r8 is disposed between the tenth active layer r3 and the thirteenth active layer r7.

For example, the tenth active layer r3, the eleventh active layer r2, the twelfth active layer r6, the thirteenth active layer r7 and the fourteenth active layer r8 are all located in the semiconductor layer Poly. Therefore, these active layers as described above may be manufactured simultaneously, which simplifies the manufacturing process of the display substrate 1000.

For example, a direction of the channel length of the tenth active layer r3, a direction of the channel length of the eleventh active layer r2, a direction of the channel length of the twelfth active layer r6, a direction of the channel length of the thirteenth active layer r7 and a direction of the channel length of the fourteenth active layer r8 are the same as the column direction Y. In this way, it may be possible to reduce the width occupied by these active layers along the row direction X, and facilitate the narrow bezel of the display substrate 1000.

In some examples, the tenth active layer r3 and the eleventh active layer r2 are arranged sequentially along the column direction Y, and are of an integral structure.

In this way, since the tenth active layer r3 and the eleventh active layer r2 are arranged sequentially along the column direction Y, the dimensions of the tenth active layer r3 and the eleventh active layer r2 along the row direction X may be reduced, and the area occupied by the tenth active layer r3 and the eleventh active layer r2 may be reduced. The tenth active layer r3 and the eleventh active layer r2 are of an integral structure, so that there is no gap between the tenth active layer r3 and the eleventh active layer r2, the dimensions of the tenth active layer r3 and the eleventh active layer r2 along the column direction Y may be reduced, and the area occupied by the tenth active layer r3 and the eleventh active layer r2 may be reduced. Therefore, it may be possible to reduce the area occupied by the scan driving circuit 100 on the display substrate 1000, and in turn realize the narrow bezel of the display substrate 1000, and simplify the manufacturing process of the display substrate 1000.

In some examples, the twelfth active layer r6 and the thirteenth active layer r7 are arranged sequentially along the column direction Y, and are of an integral structure.

In this way, since the twelfth active layer r6 and the thirteenth active layer r7 are arranged sequentially along the column direction Y, it may be possible to reduce the dimensions of the twelfth active layer r6 and the thirteenth active layer r7 along the row direction X, and reduce the area occupied by the twelfth active layer r6 and the thirteenth active layer r7. The twelfth active layer r6 and the thirteenth active layer r7 are of an integral structure, so that there is no gap between the twelfth active layer r6 and the thirteenth active layer r7, the dimensions of the twelfth active layer r6 and the thirteenth active layer r7 along the column direction Y may be reduced, and the area occupied by the twelfth active layer r6 and the thirteenth active layer r7 may be reduced. Therefore, it may be possible to reduce the area occupied by the scan driving circuit 100 on the display substrate 1000, and in turn realize the narrow bezel of the display substrate 1000, and simplify the manufacturing process of the display substrate 1000.

For example, portions of the first gate conductive layer Gate1 that overlap with the semiconductor layer Poly are used as the control electrode of the first input transistor T3, the control electrode of the second input transistor T1, the control electrode of the first control transistor T2, the control electrode of the second control transistor T6, the control electrode of the third control transistor T7, the control electrode of the fourth control transistor T8, the control electrode of the third input transistor R3, the control electrode of the fourth input transistor R1, the control electrode of the fifth control transistor R2, the control electrode of the sixth control transistor R6, the control electrode of the seventh control transistor R7, and the control electrode of the eighth control transistor R8. Other portions of the first gate conductive layer Gate1 are used as the second electrode plate of the first capacitor C1, the second electrode plate of the second capacitor C2, the second electrode plate of the third capacitor C10, and the second electrode plate of the fourth capacitor C20.

For example, a material of the first gate conductive layer Gate1 includes a conductive metal. The conductive metal may include at least one of aluminum, copper or molybdenum, and the present disclosure is not limited thereto.

In some examples, a first gate insulating layer is provided between the semiconductor layer Poly and the first gate conductive layer Gate1, and the first gate insulating layer is used to electrically insulate the semiconductor layer Poly from the first gate conductive layer Gate1.

For example, a material of the first gate insulating layer includes any one of inorganic insulating materials such as silicon nitride, silicon oxynitride and silicon oxide. The material of the first gate insulating layer may include silicon dioxide, and the present disclosure is not limited thereto.

For example, as shown in FIGS. 10 and 18, the display substrate 1000 includes a gate conductive layer Gate2 disposed on a side of the semiconductor layer Poly away from the substrate 200. To distinguish from the aforementioned first gate conductive layer Gate1, this gate conductive layer Gate2 will be hereinafter referred to as a second gate conductive layer Gate2.

For example, the second gate conductive layer Gate2 and the first gate conductive layer Gate1 may be made of the same material.

For example, the first electrode plate of the second capacitor C2 of the scan circuit 11 is located in the second gate conductive layer Gate2.

For example, the first electrode plate of the fourth capacitor C20 of the reset circuit 12 is located in the second gate conductive layer Gate2.

For example, the first electrode plate of the first capacitor C1, the first electrode plate of the second capacitor C2, the first electrode plate of the third capacitor C10 and the first electrode plate of the fourth capacitor C20 may all be located in the second gate conductive layer Gate2. In this way, it may be possible to simplify the manufacturing process of the display substrate 1000.

For example, the scan signal output terminal GO of the scan circuit 11 and the first electrode plate of the second capacitor C2 are of an integral structure. Thus, it may be possible to simplify the manufacturing process of the scan circuit 11, and in turn simplify the manufacturing process of the display substrate 1000.

For example, the reset signal output terminal RO of the reset circuit 12 and the first electrode plate of the fourth capacitor C20 of the reset circuit 12 are of an integral structure. In this way, it may be possible to simplify the manufacturing process of the reset circuit 12, and in turn simplify the manufacturing process of the display substrate 1000.

In some examples, as shown in FIGS. 10 and 18, the display substrate 1000 further includes a source-drain conductive layer SD disposed on a side of the second gate conductive layer Gate2 away from the substrate 200.

For example, the second electrode of the first output transistor T4 and the second electrode of the third output transistor T5 are of an integral structure, and are both located in the source-drain conductive layer SD. In this way, it may be possible to simplify the manufacturing process of the scan circuit 11, and in turn simplify the manufacturing process of the display substrate 1000.

For example, the second electrode of the second output transistor R4 and the second electrode of the fourth output transistor R5 are of an integral structure, and are both located in the source-drain conductive layer SD. In this way, it may be possible to simplify the manufacturing process of the reset circuit 12, and in turn simplify the manufacturing process of the display substrate 1000.

For example, the second electrode of the first output transistor T4 is electrically connected to the first electrode plate of the second capacitor C2.

For example, the scan signal output terminal GO of the scan circuit 11 and the first electrode plate of the second capacitor C2 are of an integral structure.

For example, the second electrode of the first output transistor T4 is electrically connected to the first electrode plate of the second capacitor C2 through via hole(s). Since the scan signal output terminal GO and the first electrode plate of the second capacitor C2 are of an integral structure, the second electrode of the first output transistor T4 may be electrically connected to the scan signal output terminal GO.

For example, the second electrode of the second output transistor R4 is electrically connected to the first electrode plate of the fourth capacitor C20.

For example, the reset signal output terminal RO of the reset circuit 12 and the first electrode plate of the fourth capacitor C20 are of an integral structure.

For example, the second electrode of the second output transistor R4 is electrically connected to the first electrode plate of the fourth capacitor C20 through via hole(s). Since the reset signal output terminal RO of the reset circuit 12 and the first electrode plate of the fourth capacitor C20 are of an integral structure, the second electrode of the second output transistor R4 may be electrically connected to the reset signal output terminal RO.

In some examples, a second gate insulating layer is provided between the second gate insulating layer Gate2 and the first gate conductive layer Gate1. The second gate insulating layer is used to electrically insulate the second gate conductive layer Gate2 from the first gate conductive layer Gate1.

For example, a material of the second gate insulating layer Gate2 includes any one of inorganic insulating materials such as silicon nitride, silicon oxynitride and silicon oxide. The material of the second gate insulating layer may include silicon dioxide, and the present disclosure is not limited thereto.

In some examples, a third gate insulating layer is provided between the second gate conductive layer Gate2 and the source-drain conductive layer SD. The third gate insulating layer is used to electrically insulate the second gate conductive layer Gate2 from the source-drain conductive layer SD.

For example, a material of the third gate insulating layer includes any one of inorganic insulating materials such as silicon nitride, silicon oxynitride and silicon oxide. The material of the third gate insulating layer may include silicon dioxide, and the present disclosure is not limited thereto.

In some examples, through via holes provided in the third gate insulating layer, the second gate insulating layer and the first gate insulating layer, portions of the source-drain conductive layer SD may be connected to the conductive portion of each active layer disposed on the semiconductor layer Poly, so as to form the first electrode and the second electrode of each transistor.

Figure 11:
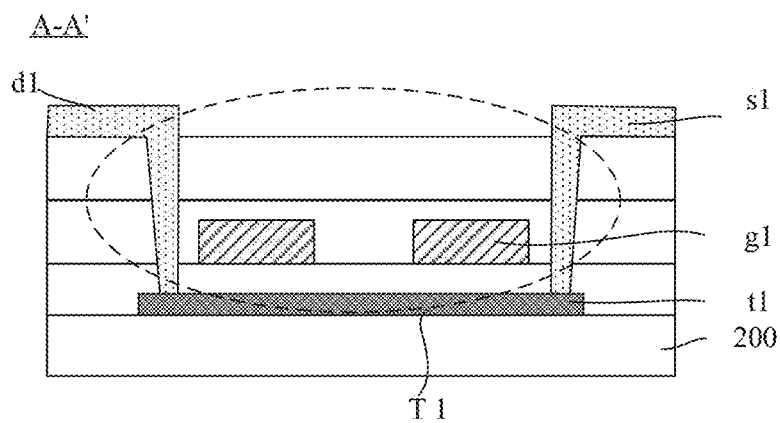
FIG. 11 is a partial sectional view of the display substrate shown in FIG. 10 taken along the A-A' direction.

FIG. 11 is a partial sectional view of the display substrate 1000 in FIG. 10 taken along the A-A' direction. In FIG. 11, the second input transistor T1 has a double-gate structure, that is, the second input transistor T1 includes two gates gi. Referring to FIG. 13, the active layer t1 of the second input transistor T1 includes two channel portions t12 and t14. For example, the fourth input transistor R1 includes an active layer r1, and the active layer r1 includes two channel portions r12 and r14 (referring to FIG. 20).

Figure 12:
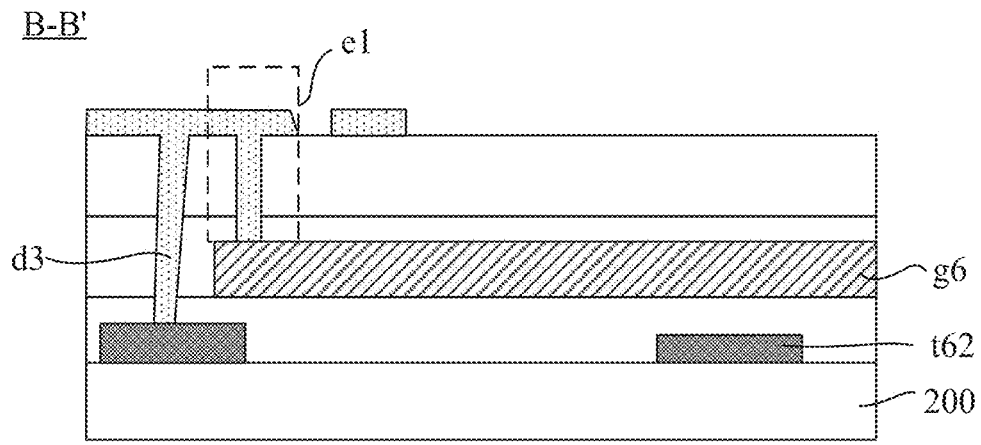
FIG. 12 is a partial sectional view of the display substrate shown in FIG. 10 taken along the B-B' direction.

For example, FIG. 12 is a partial sectional view of the display substrate 1000 in FIG. 11 taken along the B-B' direction. The control electrode g6 of the second control transistor T6 is electrically connected to an end of a first transfer portion e1, and another end of the first transfer portion e1 is electrically connected to the first electrode d3 of the first input transistor T3, so that the control electrode g6 of the second control transistor T6 is electrically connected to the first electrode d3 of the first input transistor T3. For example, the first transfer portion e1 may be located in the source-drain conductive layer SD, and the end of the first transfer portion e1 may be electrically connected to the control electrode g6 of the second control transistor T6 through a via hole.

For example, FIG. 19 is a partial sectional view of the display substrate 1000 in FIG. 18 taken along the C-C' direction. The control electrode rg6 of the sixth control transistor R6 is electrically connected to an end of a second transfer portion e2, and another end of the second transfer portion e2 is electrically connected to the first electrode rd3 of the third input transistor R3, so that the control electrode rg6 of the sixth control transistor R6 is electrically connected to the first electrode rd3 of the third input transistor R3. For example, the second transfer portion e2 may be divided into three parts. The first part of the second transfer portion e2 is located in the source-drain conductive layer SD, and an end of the first part is electrically connected to the control electrode rg6 of the sixth control transistor R6 through a via hole; the second part of the second transfer portion e2 is located in the second gate conductive layer Gate2, and an end of the second part is electrically connected to another end of the first part of the second transfer portion e2 through a via hole; the third part of the second transfer portion e2 is located in the source-drain conductive layer SD, an end of the third part is electrically connected to another end of the second part of the second transfer portion e2 through a via hole, and another end of the third part is electrically connected to the first electrode rd3 of the third input transistor R3.

The electrical connection manner between the control electrode of the second control transistor T6 and the first electrode d3 of the first input transistor T3 may also adopt the electrical connection manner between the control electrode of the sixth control transistor R6 and the first electrode rd3 of the third input transistor R3 as shown in FIG. 19. The electrical connection manner between the control electrode of the sixth control transistor T6 and the first electrode rd3 of the third input transistor T3 may also adopt the electrical connection manner between the control electrode of the second control transistor T6 and the first electrode d3 of the third input transistor T3 as shown in FIG. 12.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, configured to be applied to a display substrate including a plurality of rows of sub-pixels;
    the shift register being electrically connected to a single row of sub-pixels in the plurality of rows of sub-pixels, and being further configured to transmit a scan signal and a reset signal to the single row of sub-pixels; wherein
    the shift register comprises:
    a scan circuit electrically connected to a first input signal terminal, a first clock signal terminal, a second clock signal terminal, a first voltage signal terminal and a second voltage signal terminal; the scan circuit being configured to output the scan signal due to cooperation of a first input signal transmitted by the first input signal terminal, a first clock signal transmitted by the first clock signal terminal, a second clock signal transmitted by the second clock signal terminal, a first voltage signal transmitted by the first voltage signal terminal and a second voltage signal transmitted by the second voltage signal terminal; and
    a reset circuit electrically connected to a second input signal terminal, a third clock signal terminal, a fourth clock signal terminal, a third voltage signal terminal and a fourth voltage signal terminal; the reset circuit being configured to output the reset signal due to cooperation of a second input signal transmitted by the second input signal terminal, a third clock signal transmitted by the third clock signal terminal, a fourth clock signal transmitted by the fourth clock signal terminal, a third voltage signal transmitted by the third voltage signal terminal and a fourth voltage signal transmitted by the fourth voltage signal terminal;
    wherein the scan circuit and the reset circuit are configured to output signals independently from each other;
    the scan circuit includes a first output transistor; a first electrode of the first output transistor is electrically connected to the second voltage signal terminal, and a second electrode of the first output transistor is electrically connected to a scan signal output terminal; and
    the reset circuit includes a second output transistor; a first electrode of the second output transistor is electrically connected to the fourth voltage signal terminal, and a second electrode of the second output transistor is electrically connected to a reset signal output terminal;
    wherein a channel width of the first output transistor is greater than or equal to a channel width of the second output transistor; or
    a channel width of the first output transistor is greater than or equal to a channel width of the second output transistor, and a ratio of the channel width of the first output transistor to the channel width of the second output transistor is in a range from 1:1 to 20:1, inclusive.

2. The shift register according to claim 1, wherein the scan circuit includes a third output transistor;
    a first electrode of the third output transistor is electrically connected to the second clock signal terminal, and a second electrode of the third output transistor is electrically connected to a scan signal output terminal;
    the reset circuit includes a fourth output transistor;
    a first electrode of the fourth output transistor is electrically connected to the fourth clock signal terminal, and a second electrode of the fourth output transistor is electrically connected to a reset signal output terminal;
    wherein a channel width of the third output transistor is greater than or equal to a channel width of the fourth output transistor; or
    a channel width of the third output transistor is greater than or equal to a channel width of the fourth output transistor, and a ratio of the channel width of the third output transistor to the channel width of the fourth output transistor is in a range from 1:1 to 20:1, inclusive.

3. The shift register according to claim 1, wherein the scan circuit and the reset circuit are arranged in parallel along a row direction; or
    the scan circuit and the reset circuit are staggered along the row direction.

4. The shift register according to claim 1, wherein the reset circuit is closer to the single row of sub-pixels than the scan circuit.

5. A scan driving circuit, comprising a plurality of shift registers according to claim 1, wherein
    scan circuits in the plurality of shift registers are arranged sequentially along a column direction; and
    reset circuits in the plurality of shift registers are arranged sequentially along the column direction.

6. The scan driving circuit according to claim 5, further comprising:
    a first voltage signal line extending along the column direction and being electrically connected to the first voltage signal terminal of the scan circuit;
    a second voltage signal line extending along the column direction and being electrically connected to the second voltage signal terminal of the scan circuit;
    a third voltage signal line extending along the column direction and being electrically connected to the third voltage signal terminal of the reset circuit; and a fourth voltage signal line extending along the column direction and being electrically connected to the fourth voltage signal terminal of the reset circuit;

wherein the scan circuit is disposed between the first voltage signal line and the second voltage signal line, and the reset circuit is disposed between the third voltage signal line and the fourth voltage signal line; or the scan circuit is disposed between the first voltage signal line and the second voltage signal line, the reset circuit is disposed between the third voltage signal line and the fourth voltage signal line, and the second voltage signal line and the third voltage signal line are disposed between the scan circuit and the reset circuit.

7. The scan driving circuit according to claim 6, further comprising:

a first clock signal line extending along the column direction and being electrically connected to a first clock signal terminal of a (2m−1)-th scan circuit and a second clock signal terminal of a 2m-th scan circuit;

a second clock signal line extending along the column direction and being electrically connected to a second clock signal terminal of the (2m−1)-th scan circuit and a first clock signal terminal of the 2m-th scan circuit;

a third clock signal line extending along the column direction and being electrically connected to a third clock signal terminal of the (2m−1)-th reset circuit and a fourth clock signal terminal of the 2m-th reset circuit; and a fourth clock signal line extending along the column direction and being electrically connected to a fourth clock signal terminal of the (2m−1)-th reset circuit and a third clock signal terminal of the 2m-th reset circuit, m being a positive integer;

wherein the first clock signal line and the second clock signal line are disposed on a side of the scan circuit away from the reset circuit; and the third clock signal line and the fourth clock signal line are disposed on a side of the reset circuit proximate to the scan circuit.

8. The scan driving circuit according to claim 6, further comprising:

a first initial signal line extending along the column direction and being electrically connected to first input signal terminals of scan circuits in first n shift registers of the plurality of shift registers, n being a positive integer; and a second initial signal line extending along the column direction and being electrically connected to second input signal terminals of reset circuits in first i shift registers of the plurality of shift registers, i being a positive integer;

wherein the first initial signal line is disposed on a side of the scan circuit away from the reset circuit; and the second initial signal line is disposed on a side of the reset circuit proximate to the scan circuit.

9. A display substrate, comprising:

a substrate;

the plurality of rows of sub-pixels disposed on the substrate; and at least one scan driving circuit according to claim 5, the at least one scan driving circuit being disposed on the substrate;

wherein each shift register in the scan driving circuit is electrically connected to one row of sub-pixels, and is configured to transmit a scan signal and a reset signal to the one row of sub-pixels.

10. The display substrate according to claim 9, wherein the at least one scan driving circuit includes two scan driving circuits; and the two scan driving circuits are located on two opposite sides of the plurality of rows of sub-pixels, respectively.

11. The display substrate according to claim 9, wherein the display substrate comprises a semiconductor layer disposed on the substrate, wherein a first output transistor of the scan circuit in the shift register includes a first active layer, and the first active layer includes a first channel portion;

a second output transistor of the reset circuit in the shift register includes a second active layer, and the second active layer includes a second channel portion;

wherein the first active layer and the second active layer are both located in the semiconductor layer, and a channel width of the first channel portion is greater than or equal to a channel width of the second channel portion; or the first active layer and the second active layer are both located in the semiconductor layer, a channel width of the first channel portion is greater than or equal to a channel width of the second channel portion, and a direction of the channel width of the first channel portion and a direction of the channel width of the second channel portion are the same as a row direction.

12. The display substrate according to claim 11, wherein a third output transistor of the scan circuit includes a third active layer, and the third active layer includes a third channel portion;

a fourth output transistor of the reset circuit includes a fourth active layer, and the fourth active layer includes a fourth channel portion;

wherein the third active layer and the fourth active layer are both located in the semiconductor layer, and a channel width of the third channel portion is greater than or equal to a channel width of the fourth channel portion; or the third active layer and the fourth active layer are both located in the semiconductor layer, a channel width of the third channel portion is greater than or equal to a channel width of the fourth channel portion, and a direction of the channel width of the third channel portion and a direction of the channel width of the fourth channel portion are the same as the row direction.

13. The display substrate according to claim 12, wherein the first active layer and the third active layer are arranged sequentially along a column direction, the column direction intersecting the row direction; and/or the second active layer and the fourth active layer are arranged sequentially along the column direction.

14. The display substrate according to claim 12, wherein the first active layer and the third active layer are of an integral structure; and/or the second active layer and the fourth active layer are of an integral structure.

15. The display substrate according to claim 11, further comprising a gate conductive layer and a source-drain conductive layer that are disposed on a side of the semiconductor layer away from the substrate and stacked sequentially; wherein a first electrode plate of a second capacitor of the scan circuit is located in the gate conductive layer; a second electrode of the first output transistor and a second electrode of a third output transistor of the scan circuit are of an integral structure, and both are located in the source-drain conductive layer; a second electrode of the first output transistor is electrically connected to the first electrode plate of the second capacitor; and a scan signal output terminal of the scan circuit and the first electrode plate of the second capacitor are of an integral structure; or a first electrode plate of a second capacitor of the scan circuit is located in the gate conductive layer; a second electrode of the first output transistor and a second electrode of a third output transistor of the scan circuit are of an integral structure, and both are located in the source-drain conductive layer; a second electrode of the first output transistor is electrically connected to the first electrode plate of the second capacitor; a scan signal output terminal of the scan circuit and the first electrode plate of the second capacitor are of an integral structure; a first electrode plate of a fourth capacitor of the reset circuit is located in the gate conductive layer; a second electrode of the second output transistor and a second electrode of a fourth output transistor of the reset circuit are of an integral structure, and are both located in the source-drain conductive layer; the second electrode of the second output transistor is electrically connected to the first electrode plate of the fourth capacitor; and a reset signal output terminal of the reset circuit and the first electrode plate of the fourth capacitor are of an integral structure.

16. The display substrate according to claim 11, wherein a first input transistor of the scan circuit includes a fifth active layer disposed on a side of the first active layer away from the plurality of rows of sub-pixels;

a first control transistor of the scan circuit includes a sixth active layer disposed on the side of the first active layer away from the plurality of rows of sub-pixels;

a second control transistor of the scan circuit includes a seventh active layer disposed between the fifth active layer and the first active layer;

a third control transistor of the scan circuit includes an eighth active layer disposed between the fifth active layer and the first active layer;

a fourth control transistor of the scan circuit includes a ninth active layer disposed between the fifth active layer and the eighth active layer;

wherein the fifth active layer, the sixth active layer, the seventh active layer, the eighth active layer and the ninth active layer are all located in the semiconductor layer;

a direction of a channel length of the fifth active layer, a direction of a channel length of the sixth active layer, a direction of a channel length of the seventh active layer, a direction of a channel length of the eighth active layer and a direction of a channel length of the ninth active layer are the same as a column direction, the column direction intersecting the row direction.

17. The display substrate according to claim 16, wherein the fifth active layer and the sixth active layer are arranged sequentially along the column direction, and are of an integral structure; and/or the seventh active layer and the eighth active layer are arranged sequentially along the column direction, and are of an integral structure.

18. The display substrate according to claim 16, wherein a third input transistor of the reset circuit includes a tenth active layer disposed on a side of the second active layer away from the plurality of rows of sub-pixels;

a fifth control transistor of the reset circuit includes an eleventh active layer disposed on the side of the second active layer away from the plurality of rows of sub-pixels;

a sixth control transistor of the reset circuit includes a twelfth active layer disposed between the tenth active layer and the second active layer;

a seventh control transistor of the reset circuit includes a thirteenth active layer disposed between the tenth active layer and the second active layer;

an eighth control transistor of the reset circuit includes a fourteenth active layer disposed between the tenth active layer and the thirteenth active layer;

wherein the tenth active layer, the eleventh active layer, the twelfth active layer, the thirteenth active layer and the fourteenth active layer are all located in the semiconductor layer;

a direction of a channel length of the tenth active layer, a direction of a channel length of the eleventh active layer, a direction of a channel length of the twelfth active layer, a direction of a channel length of the thirteenth active layer and a direction of a channel length of the fourteenth active layer are the same as the column direction.

19. A shift register, configured to be applied to a display substrate including a plurality of rows of sub-pixels;

the shift register being electrically connected to a single row of sub-pixels in the plurality of rows of sub-pixels, and being further configured to transmit a scan signal and a reset signal to the single row of sub-pixels; wherein the shift register comprises:

a scan circuit electrically connected to a first input signal terminal, a first clock signal terminal, a second clock signal terminal, a first voltage signal terminal and a second voltage signal terminal; the scan circuit being configured to output the scan signal due to cooperation of a first input signal transmitted by the first input signal terminal, a first clock signal transmitted by the first clock signal terminal, a second clock signal transmitted by the second clock signal terminal, a first voltage signal transmitted by the first voltage signal terminal and a second voltage signal transmitted by the second voltage signal terminal; and a reset circuit electrically connected to a second input signal terminal, a third clock signal terminal, a fourth clock signal terminal, a third voltage signal terminal and a fourth voltage signal terminal; the reset circuit being configured to output the reset signal due to cooperation of a second input signal transmitted by the second input signal terminal, a third clock signal transmitted by the third clock signal terminal, a fourth clock signal transmitted by the fourth clock signal terminal, a third voltage signal transmitted by the third voltage signal terminal and a fourth voltage signal transmitted by the fourth voltage signal terminal;

wherein the scan circuit and the reset circuit are configured to output signals independently from each other; and the scan circuit includes: a first input transistor, a second input transistor, a first control transistor, a second control transistor, a third control transistor, a fourth control transistor, a first output transistor, a third output transistor, a first capacitor and a second capacitor, wherein a control electrode of the first input transistor is electrically connected to the first clock signal terminal, a first electrode of the first input transistor is electrically connected to the first voltage signal terminal, and a second electrode of the first input transistor is electrically connected to a second node;

a control electrode of the second input transistor is electrically connected to the first clock signal terminal, a first electrode of the second input transistor is electrically connected to the first input signal terminal, and a second electrode of the second input transistor is electrically connected to a first node;

a control electrode of the first control transistor is electrically connected to the first node, a first electrode of the first control transistor is electrically connected to the first clock signal terminal, and a second electrode of the first control transistor is electrically connected to the second node;

a control electrode of the second control transistor is electrically connected to the second node, a first electrode of the second control transistor is electrically connected to the second voltage signal terminal, and a second electrode of the second control transistor is electrically connected to a third node;

a control electrode of the third control transistor is electrically connected to the second clock signal terminal, a first electrode of the third control transistor is electrically connected to the third node, and a second electrode of the third control transistor is electrically connected to the first node;

a control electrode of the fourth control transistor is electrically connected to the first voltage signal terminal, a first electrode of the fourth control transistor is electrically connected to the first node, and a second electrode of the fourth control transistor is electrically connected to a fourth node;

a control electrode of the first output transistor is electrically connected to the second node, a first electrode of the first output transistor is electrically connected to the second voltage signal terminal, and a second electrode of the first output transistor is electrically connected to a scan signal output terminal;

a control electrode of the third output transistor is electrically connected to the fourth node, a first electrode of the third output transistor is electrically connected to the second clock signal terminal, and a second electrode of the third output transistor is electrically connected to the scan signal output terminal;

a first electrode plate of the first capacitor is electrically connected to the second voltage signal terminal, and a second electrode plate of the first capacitor is electrically connected to the second node; and a first electrode plate of the second capacitor is electrically connected to the scan signal output terminal, and a second electrode plate of the second capacitor is electrically connected to the fourth node; and/or the reset circuit includes: a third input transistor, a fourth input transistor, a fifth control transistor, a sixth control transistor, a seventh control transistor, an eighth control transistor, a second output transistor, a fourth output transistor, a third capacitor and a fourth capacitor, wherein a control electrode of the third input transistor is electrically connected to the third clock signal terminal, a first electrode of the third input transistor is electrically connected to the third voltage signal terminal, and a second electrode of the third input transistor is electrically connected to a sixth node;

a control electrode of the fourth input transistor is electrically connected to the third clock signal terminal, a first electrode of the fourth input transistor is electrically connected to the second input signal terminal, and a second electrode of the fourth input transistor is electrically connected to a fifth node;

a control electrode of the fifth control transistor is electrically connected to the fifth node, a first electrode of the fifth control transistor is electrically connected to the third clock signal terminal, and a second electrode of the fifth control transistor is electrically connected to the sixth node;

a control electrode of the sixth control transistor is electrically connected to the sixth node, a first electrode of the sixth control transistor is electrically connected to the fourth voltage signal terminal, and a second electrode of the sixth control transistor is electrically connected to a seventh node;

a control electrode of the seventh control transistor is electrically connected to the fourth clock signal terminal, a first electrode of the seventh control transistor is electrically connected to the seventh node, and a second electrode of the seventh control transistor is electrically connected to the fifth node;

a control electrode of the eighth control transistor is electrically connected to the third voltage signal terminal, a first electrode of the eighth control transistor is electrically connected to the fifth node, and a second electrode of the eighth control transistor is electrically connected to an eighth node;

a control electrode of the second output transistor is electrically connected to the sixth node, a first electrode of the second output transistor is electrically connected to the fourth voltage signal terminal, and a second electrode of the second output transistor is electrically connected to a reset signal output terminal;

a control electrode of the fourth output transistor is electrically connected to the eighth node, a first electrode of the fourth output transistor is electrically connected to the fourth clock signal terminal, and a second electrode of the fourth output transistor is electrically connected to the reset signal output terminal;

a first electrode plate of the third capacitor is electrically connected to the fourth voltage signal terminal, and a second electrode plate of the third capacitor is electrically connected to the sixth node; and a first electrode plate of the fourth capacitor is electrically connected to the reset signal output terminal, and a second electrode plate of the fourth capacitor is electrically connected to the eighth node.

20. A shift register, configured to be applied to a display substrate including a plurality of rows of sub-pixels;
the shift register being electrically connected to a single row of sub-pixels in the plurality of rows of sub-pixels, and being further configured to transmit a scan signal and a reset signal to the single row of sub-pixels; wherein
the shift register comprises:
a scan circuit electrically connected to a first input signal terminal, a first clock signal terminal, a second clock signal terminal, a first voltage signal terminal and a second voltage signal terminal; the scan circuit being configured to output the scan signal due to cooperation of a first input signal transmitted by the first input signal terminal, a first clock signal transmitted by the first clock signal terminal, a second clock signal transmitted by the second clock signal terminal, a first voltage signal transmitted by the first voltage signal terminal and a second voltage signal transmitted by the second voltage signal terminal; and
a reset circuit electrically connected to a second input signal terminal, a third clock signal terminal, a fourth clock signal terminal, a third voltage signal terminal and a fourth voltage signal terminal; the reset circuit being configured to output the reset signal due to cooperation of a second input signal transmitted by the second input signal terminal, a third clock signal transmitted by the third clock signal terminal, a fourth clock signal transmitted by the fourth clock signal terminal, a third voltage signal transmitted by the third voltage signal terminal and a fourth voltage signal transmitted by the fourth voltage signal terminal;
wherein the scan circuit and the reset circuit are configured to output signals independently from each other;
the scan circuit includes a third output transistor; a first electrode of the third output transistor is electrically connected to the second clock signal terminal, and a second electrode of the third output transistor is electrically connected to a scan signal output terminal; and
the reset circuit includes a fourth output transistor; a first electrode of the fourth output transistor is electrically connected to the fourth clock signal terminal, and a second electrode of the fourth output transistor is electrically connected to a reset signal output terminal;
wherein a channel width of the third output transistor is greater than or equal to a channel width of the fourth output transistor; or
a channel width of the third output transistor is greater than or equal to a channel width of the fourth output transistor, and a ratio of the channel width of the third output transistor to the channel width of the fourth output transistor is in a range from 1:1 to 20:1, inclusive.

* * * * *

UNITED STATES PATENT AND TRADEMARK OFFICE
CERTIFICATE OF CORRECTION

PATENT NO. : 12,293,722 B2  
APPLICATION NO. : 17/925696  
DATED : May 6, 2025  
INVENTOR(S) : Huijuan Yang et al.

Page 1 of 1

It is certified that error appears in the above-identified patent and that said Letters Patent is hereby corrected as shown below:

On the Title Page

Item (54) and in the Specification Column 1, Lines 1-3, The title should be "SHIFT REGISTER HAVING SCAN CIRCUIT AND RESET CIRCUIT, SCAN DRIVING CIRCUIT AND DISPLAY SUBSTRATE".

Signed and Sealed this  
Twelfth Day of August, 2025

Coke Morgan Stewart  
*Acting Director of the United States Patent and Trademark Office*